United States Patent [19]
Toyama et al.

[11] Patent Number: 5,589,403
[45] Date of Patent: Dec. 31, 1996

[54] METHOD FOR PRODUCING PHOTOVOLTAIC DEVICE

[75] Inventors: Noboru Toyama; Katsumi Nakagawa, both of Nagahama, Japan

[73] Assignee: Canon Kabushiki Kaisha, Tokyo, Japan

[21] Appl. No.: 573,996

[22] Filed: Mar. 18, 1996

Related U.S. Application Data

[62] Division of Ser. No. 341,948, Nov. 16, 1994, Pat. No. 5,500,055, which is a continuation of Ser. No. 13,109, Feb. 3, 1993, abandoned.

[30] Foreign Application Priority Data

Feb. 5, 1992 [JP] Japan .................................. 4-20052

[51] Int. Cl.⁶ .................................................. H01K 31/18
[52] U.S. Cl. ............................... 437/2; 437/4; 437/180; 437/181; 437/189; 437/228
[58] Field of Search .................... 437/2, 4, 180–181, 437/189, 228; 156/625.1; 136/256, 258 AM, 259; 257/436

[56] References Cited

U.S. PATENT DOCUMENTS

| | | | |
|---|---|---|---|
| 4,419,533 | 12/1983 | Czubatyj et al. | 136/259 |
| 4,492,181 | 1/1985 | Ovshinsky et al. | 118/718 |
| 4,532,372 | 7/1985 | Nath et al. | 136/256 |
| 4,532,537 | 7/1985 | Kane | 257/458 |
| 4,598,306 | 7/1986 | Nath et al. | 257/458 |
| 4,612,411 | 9/1986 | Wieting et al. | 136/265 |
| 4,694,116 | 9/1987 | Hayashi et al. | 136/256 |
| 4,808,462 | 2/1989 | Yaba et al. | 428/142 |
| 4,851,302 | 7/1989 | Nakagawa et al. | 428/658 |
| 4,880,664 | 11/1989 | O'Dowd et al. | 427/109 |
| 4,900,370 | 2/1990 | Itoga et al. | 136/256 |
| 4,959,106 | 9/1990 | Nakagawa et al. | 136/258 |
| 5,028,488 | 7/1991 | Nakagawa et al. | 428/457 |
| 5,064,477 | 11/1991 | Delahoy | 136/256 |
| 5,078,803 | 1/1992 | Pier et al. | 136/256 |
| 5,078,804 | 1/1992 | Chen et al. | 136/260 |
| 5,244,509 | 9/1993 | Arao et al. | 136/259 |
| 5,282,902 | 2/1994 | Matsuyama | 136/249 |
| 5,296,045 | 3/1994 | Banerjee et al. | 136/249 |
| 5,413,959 | 5/1995 | Yamamoto et al. | 437/174 |
| 5,453,135 | 9/1995 | Nakagawa et al. | 136/259 |

FOREIGN PATENT DOCUMENTS

| | | | |
|---|---|---|---|
| 60-041878 | 8/1980 | Japan | 136/246 |
| 2-119186 | 5/1990 | Japan | 136/259 |
| 3-99477 | 4/1991 | Japan | 136/259 |
| 4-133362 | 5/1992 | Japan | 136/259 |
| 5-343715 | 12/1993 | Japan | 136/259 |
| 6-125102 | 5/1994 | Japan | 136/259 |

OTHER PUBLICATIONS

M. Harasaka, et al., Solar Energy Materials, vol. 20 (1990), pp. 99–110.

*Primary Examiner*—Aaron Weisstuch
*Attorney, Agent, or Firm*—Fitzpatrick, Cella, Harper & Scinto

[57] ABSTRACT

A photovoltaic device comprises a metal with a smooth surface; a transparent conductive layer formed on the smooth surface; and a photoelectric conversion layer formed on the transparent conductive layer. The transparent conductive layer has an irregular surface at a side opposite to the smooth surface.

5 Claims, 14 Drawing Sheets

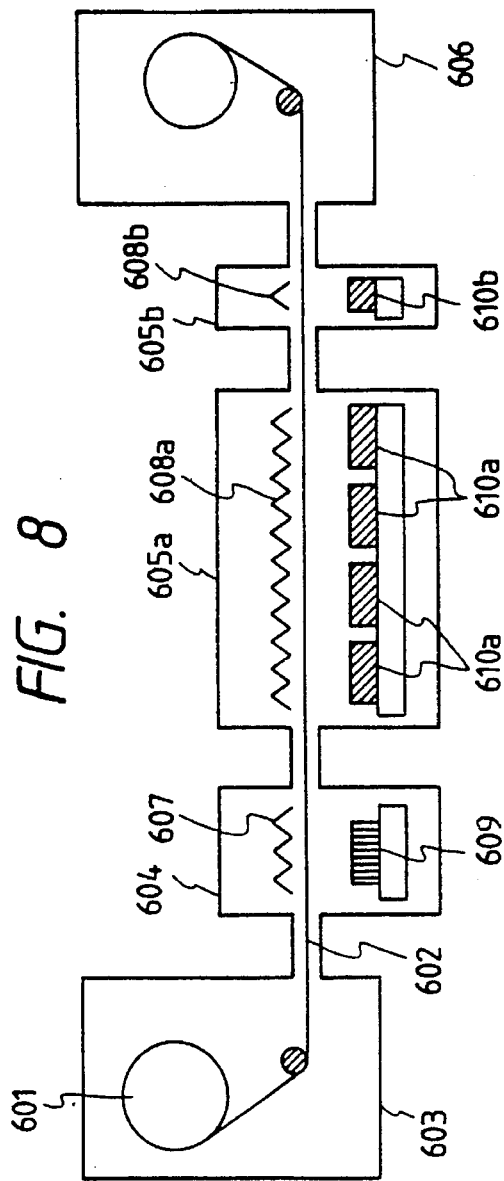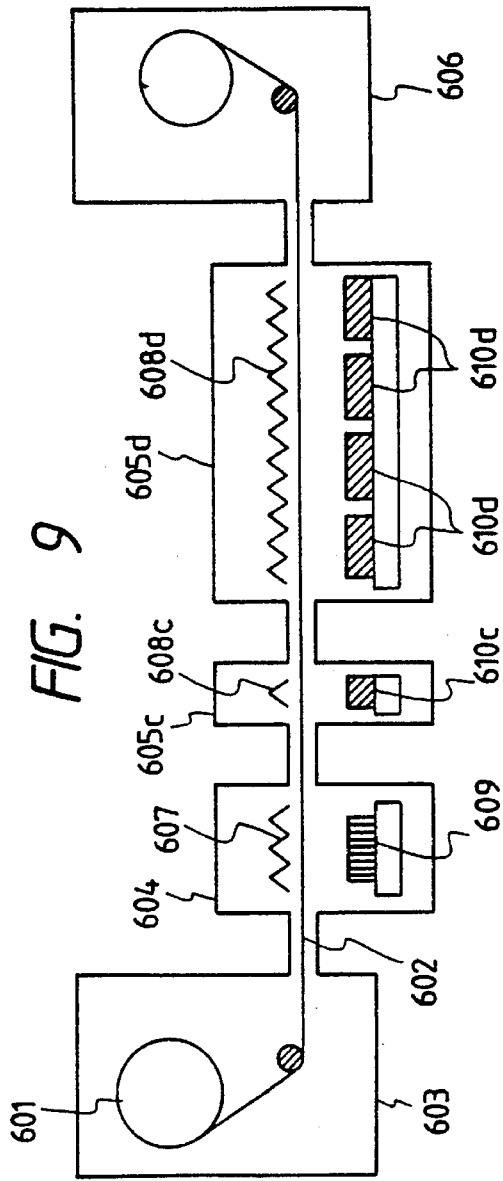

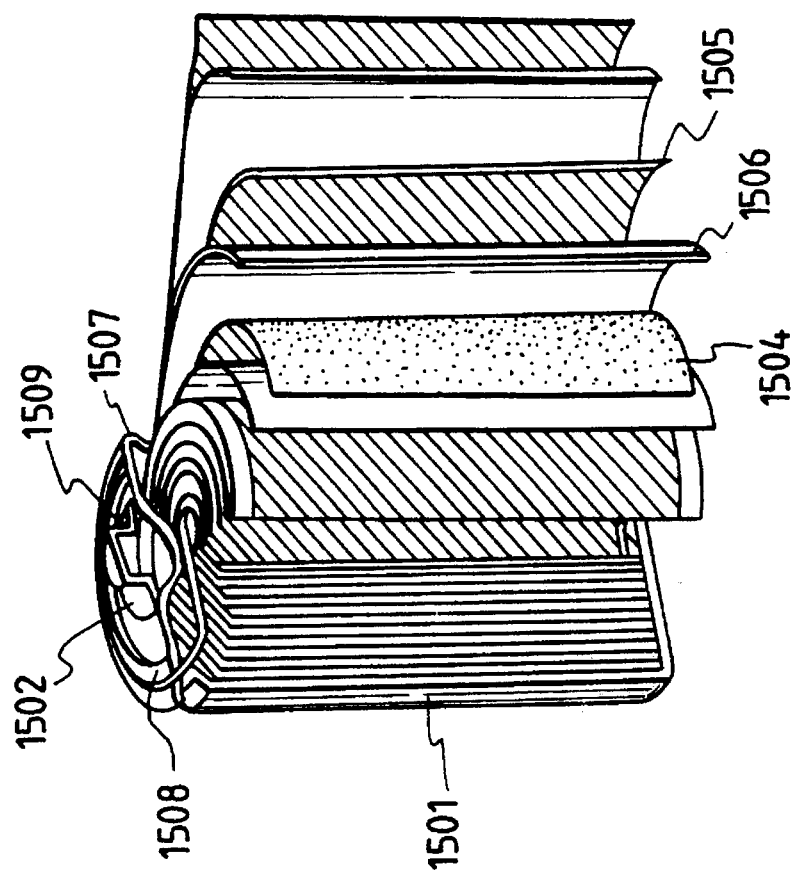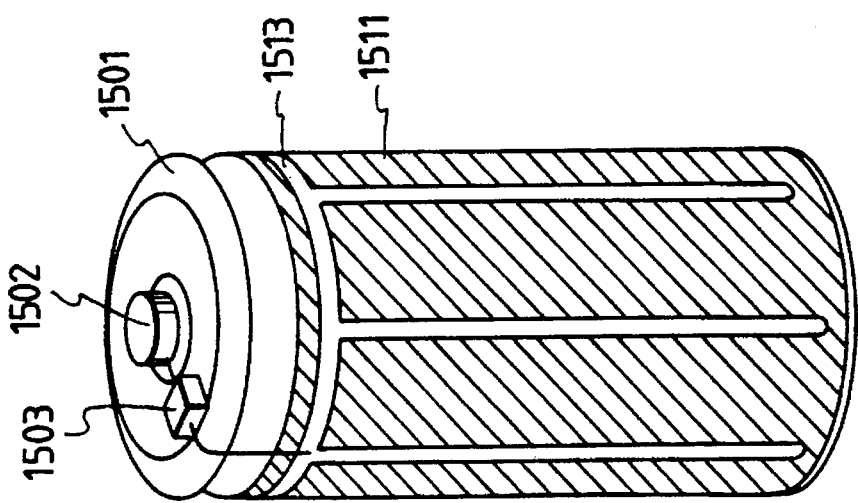

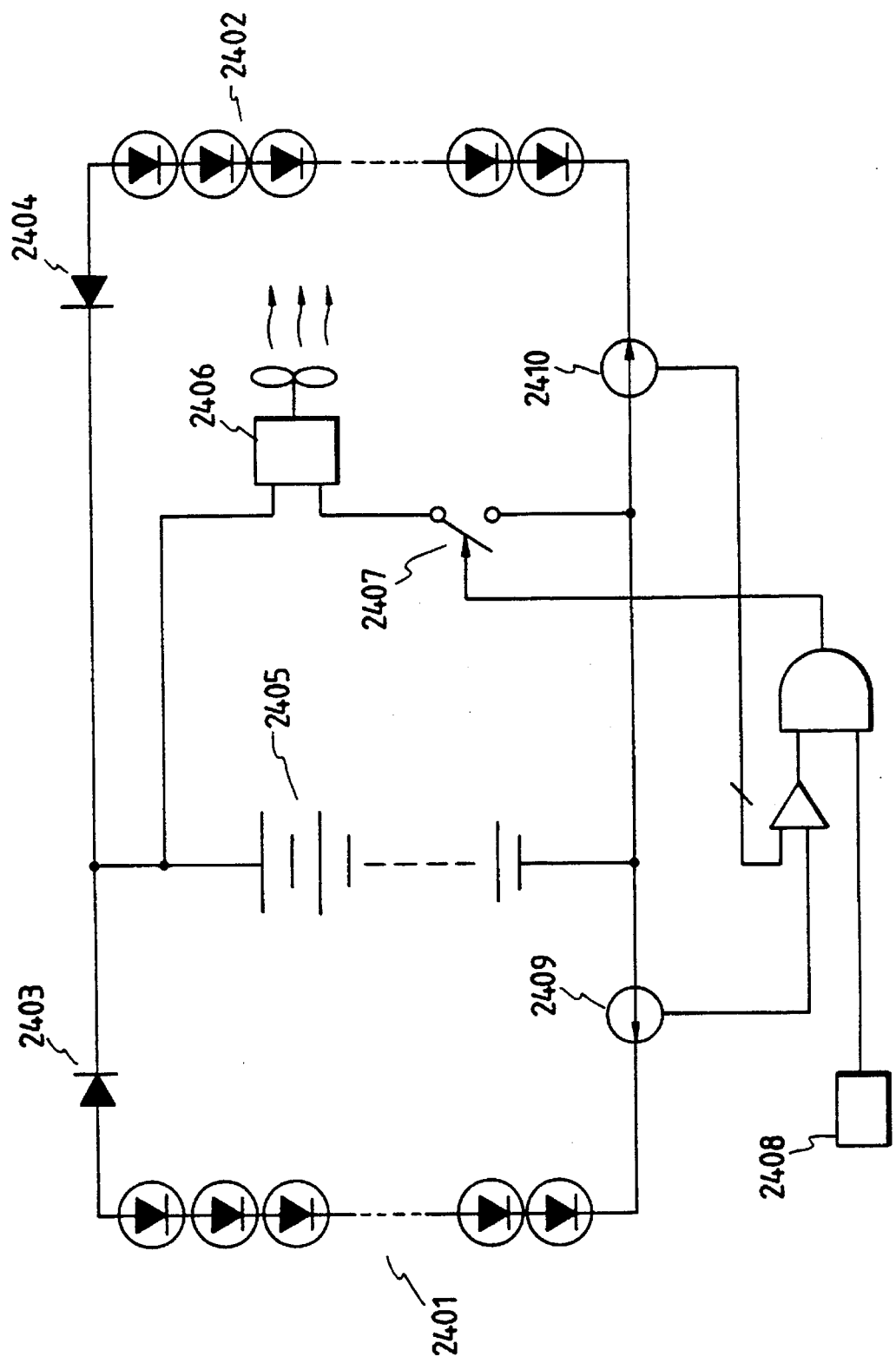

METHOD FOR PRODUCING PHOTOVOLTAIC DEVICE

This application is a division of application Ser. No. 08/341,948 filed Nov. 16, 1994, now U.S. Pat. No. 5,500,055, which in turn is a continuation of application Ser. No. 08/013,109, now abandoned.

BACKGROUND OF THE INVENTION

1. Field of the Invention

The present invention relates to a photovoltaic device of a high conversion efficiency, high reliability and satisfactory mass producibility, and a method for producing the same, and it also relates to a secondary battery, an artificial satellite, a roofing material, a solar cell module, an automobile or the like, utilizing a solar cell as an example of said photovoltaic device.

2. Related Background Art

For most future energy sources, there are involved various problems, e.g. in the total reliance on fossil fuels such as petroleum and coal, the use of which is considered to result in warming of the earth because of the by-product carbon dioxide etc., and on nuclear power, which cannot be freed from the danger of radioactivity in case of an unpredictable accident or even in ordinary operation. In contrast, solar cells utilizing solar light as an energy source have very little influence on the environment, and are expected to be used for many applications. At present, however, there are some drawbacks that hinder practical use of such solar cells.

For solar power generation, mostly monocrystalline or polycrystalline silicon have been utilized. However, such solar cells, as an example of the known photovoltaic cells, require a large amount of energy and time for crystal growth and also require complex subsequent steps, so that mass production is difficult to achieve and supply thereof at a low price has therefore been difficult. On the other hand, there have been conducted active research and development on so-called thin film semiconductor photovoltaic devices utilizing amorphous silicon (hereinafter represented as a-Si), or compound semiconductors such as CdS or $CuInSe_2$. Such photovoltaic devices can be obtained by forming the necessary semiconductor layers on an inexpensive substrate such as glass or stainless steel with a relatively simple process, and therefore offer the possibility of cost reduction. However, such thin film semiconductor photovoltaic devices have not been employed in practice because their conversion efficiency of light is lower than that of the crystalline silicon photovoltaic devices, and also their reliability under prolonged use has been low. For this reason, there have been made various attempts to improve the performance of the thin film semiconductor photovoltaic devices.

One attempt consists of providing a rear reflective layer for returning the light not absorbed by the semiconductor layer to said semiconductor layer, in order to achieve effective utilization of the incident light. For this purpose, in the case where the light is introduced through a transparent substrate, the electrode formed on the surface of the semiconductor layer is composed of a highly reflective metal such as silver (Ag), aluminum (Al), or copper (Cu). Also, in the case where the light is introduced from the top side of the semiconductor layer, a similar metal layer for increasing the reflectance is formed on the substrate, before the formation of said semiconductor layer. Also, a transparent layer with a suitable optical property may be provided between the metal layer and the semiconductor layer, for further improving the reflectance by multiple interference. FIG. 4A shows the reflectance in the case where such transparent layer is not present between silicon and various metals, and FIG. 4B shows the simulated results of improvement in reflectance, in the case when a zinc oxide (ZnO) layer is provided as such transparent layer between silicon and various metals.

Such a transparent layer is also effective in improving the reliability of the photovoltaic device. Japanese Patent Publication No. 60-41878 discloses that such a transparent layer prevents alloy formation between the semiconductor and the metal layer. Also, U.S. Pat. Nos. 4,532,372 and 4,598,306 disclose that a transparent layer with a suitable electrical resistance prevents the generation of excessive current between the electrodes even in the case of short-circuiting in the semiconductor layer.

Another attempt to improve the conversion efficiency of the photovoltaic device consists of employing a texture, having fine irregularities, on the surface of the photovoltaic device and/or the interface with the rear reflective layer. In such configuration, the light is scattered on the surface of the photovoltaic device and/or at the interface with the rear reflective layer and is confined in the semiconductor (phototrapping effect), whereby it is effectively absorbed therein. In the case where the substrate is transparent, the texture is formed on the surface of a transparent electrode, for example, of tin oxide ($SnO_2$) formed on the substrate. Also, in the case where the light is introduced from the top side of the semiconductor, the texture is formed on the surface of the metal layer employed as the rear reflective layer. M. Harasaka, K. Suzuki, K. Nakatani, M. Asano, M. Yano, and H. Okaniwa reported that an irregular texture for a rear reflective layer could be obtained by Al deposition under control of the substrate temperature and the deposition rate (*Solar Cell Materials*, vol. 20 (1990), pp. 99–110). FIG. 5 shows an example of the increase of absorption of the incident light, through the use of a rear reflective layer with such texture, wherein curve (a) indicates the spectral sensitivity of an a-Si photovoltaic device employing smooth Ag as the metal layer, while curve (b) indicates the spectral sensitivity of a similar device employing Ag of irregular texture.

It is also possible to combine the concept of the rear reflective layer consisting of a metal layer and a transparent layer, and the concept of texture structure. U.S. Pat. No. 4,419,533 discloses the concept of the rear reflective layer in which the surface of the metal layer has a textured structure and a transparent layer is formed thereon. The light conversion efficiency of the solar cell, constituting an example of the photovoltaic device, is expected to be significantly improved by such combination. However, according to the experiences of the present inventors, such improvements have not been attained in most cases. Also, under certain conditions of semiconductor deposition, the obtained solar cell does not have enough reliability for use under the conditions of high temperature and high humidity, despite the presence of the transparent layer. For these reasons, the thin film solar cells have not been employed in practical applications, though they have the possibility of low cost production.

SUMMARY OF THE INVENTION

An object of the present invention is to provide a photovoltaic device comprising a metal with a smooth surface, a transparent layer formed on said smooth surface, and a photoelectric conversion layer formed on said transparent layer, wherein a surface of said transparent layer, opposite to said smooth surface, has an irregular texture.

Another object of the present invention is to provide a photovoltaic device in which said transparent layer includes plural layers.

Still another object of the present invention is to provide a photovoltaic device wherein said transparent layer contains an impurity for increasing the electrical resistance.

Still another object of the present invention is to provide a photovoltaic device wherein said transparent layer is composed of ZnO, and said impurity is composed of Cu.

Still another object of the present invention is to provide a photovoltaic device wherein said transparent layer is composed of $SnO_2$, and said impurity is composed of Al.

Still another object of the present invention is to provide a photovoltaic device wherein, in said plural layers of the transparent layer, a layer at the side of the metal has a higher specific resistivity than in a layer at the side of the photoelectric conversion layer.

Still another object of the present invention is to provide a photovoltaic device in which said layer at the side of the metal is thicker than said layer at the side of the photoelectric conversion layer.

Still another object of the present invention is to provide a photovoltaic device in which a first layer of the transparent layer, in contact with said smooth surface, has an irregular texture on a surface thereof opposite to said smooth surface.

Still another object of the present invention is to provide a photovoltaic device in which said smooth surface has an irregular texture with a pitch not exceeding 1000 Å, and the irregularly textured surface of said first layer has an irregular texture with a pitch within a range from 3000 to 20,000 Å and irregularities of 500 Å.

Still another object of the present invention is to provide a photovoltaic device in which said transparent layer includes plural layers, wherein at least a layer provided in contact with the smooth surface of said metal has a smooth surface at the side of said photoelectric conversion layer, and at least a layer other than the above-mentioned layer has an irregular texture on a surface at the side of said photoelectric conversion layer.

Still another object of the present invention is to provide a photovoltaic device in which said smooth surface has an irregular texture with a pitch not exceeding 1000 Å, said at least a layer in contact with the metal has an irregular texture with a pitch of 3000 Å or less on the smooth surface thereof at the side of said photoelectric conversion layer, and said layer with irregular texture has an irregular texture with a pitch within a range of 3000 to 20,000 Å and irregularities within a range of 500 to 20,000 Å.

Still another object of the present invention is to provide a photovoltaic device in which a surface of said photoelectric conversion layer, opposite to said transparent layer, has an irregular texture comparable to that of said transparent layer.

Still another object of the present invention is to provide a method for producing a photovoltaic device including a metal with a smooth surface, a transparent layer and a photovoltaic layer, which comprises utilizing the difference in layer forming temperatures in the case where said transparent layer includes plural layers and a layer in contact with the smooth surface of said metal has an irregular surface texture, and, for said layer forming temperatures represented as T1 for a first layer, T2 for a second layer etc. from the side of said metal, satisfying a reaction T1>Tn between said first layer forming temperature T1 and a forming temperature Tn for the second or subsequent layer.

Still another object of the present invention is to provide a method for producing a photovoltaic device including a metal with a smooth surface, a transparent layer and a photovoltaic layer, which comprises utilizing the difference in layer forming temperatures in the case where said transparent layer includes plural layers and at least a layer other than the layer in contact with said smooth surface of the metal has an irregular surface texture, and, for said layer forming temperatures represented as T1 for the first layer, T2 for the second layer, etc. from the side of said metal, satisfying a relation T1<Tn between said first forming temperature and a forming temperature Tn for the second or subsequent layer.

Still another object of the present invention is to provide a method for producing a photovoltaic device which comprises forming an irregular surface texture in said transparent layer by immersing the surface of said layer in acid, alkali, or aqueous salt solution, after the deposition of a layer which is to be given said irregular surface texture.

Still another object of the present invention is to provide a method for producing a photovoltaic device wherein said acid is acetic acid, sulfuric acid, hydrochloric acid, nitric acid, or perchloric acid, said alkali is sodium hydroxide, potassium hydroxide, or aluminum hydroxide, and said salt is iron chloride or aluminum chloride.

Still another object of the present invention is to provide a secondary battery wherein a photovoltaic device is provided on the battery container and a reverse current-blocking diode is connected to at least one electrode of said photoelectric conversion layer.

Still another object of the present invention is to provide an artificial satellite comprising a photovoltaic device formed on a windable substrate, a rotary shaft for winding said photovoltaic device, and a power source for driving said rotary shaft.

Still another object of the present invention is to provide a roofing material comprising a corrugated plate, a plurality of photovoltaic devices formed on said corrugated plate, a conductive sheet, and a resin, wherein electric connection between said photovoltaic devices is made by said conductive sheet and a surface of said photovoltaic devices, opposite to said corrugated plate, is covered by said resin.

Still another object of the present invention is to provide a photovoltaic module comprising a plurality of photovoltaic devices and current-collecting electrodes, wherein serial connections of said photovoltaic devices have mutually equal light-receiving areas and the density of said current-collecting electrodes is elevated in the case where many of said photovoltaic devices are serially connected.

Still another object of the present invention is to provide said photovoltaic device module wherein the thickness of the transparent electrode constituting said photovoltaic devices is varied.

Still another object of the present invention is to provide an automobile comprising a photovoltaic device module provided on a rear quarter pillar.

BRIEF DESCRIPTION OF THE DRAWINGS

FIG. 8 is a schematic cross-sectional view of a sputtering apparatus adapted for producing a rear reflective layer, in the case where the first layer of the present invention has an irregular surface texture;

FIG. 9 is a schematic cross-sectional view of a sputtering apparatus adapted for producing a rear reflective layer, in the case where the second layer of the present invention has an irregular surface texture;

FIG. 13A and 13B are respectively a schematic view and a schematic exploded view of a photovoltaic device of the present invention, applied to a secondary battery;

FIG. 21 is an equivalent circuit diagram of an application of the photovoltaic device of the present invention in an automobile.

DETAILED DESCRIPTION OF THE PREFERRED EMBODIMENTS

Figure 1:
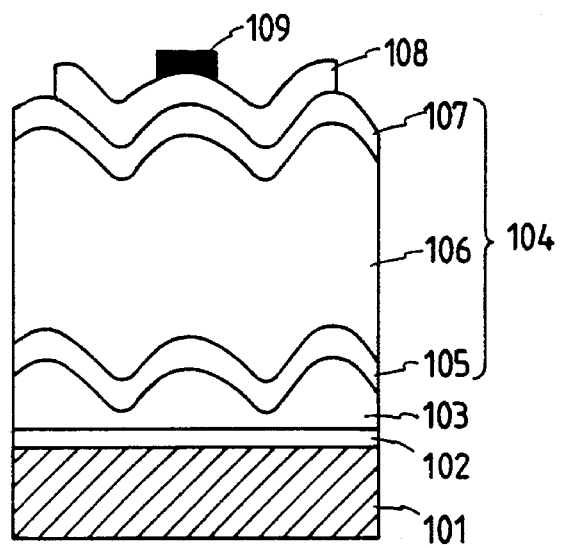
FIG. 1 is a schematic cross-sectional view of an embodiment of the photovoltaic device of the present invention, wherein the transparent layer is composed of a first layer only.

The present invention has been attained in consideration of the foregoing, and provides a photovoltaic device of high conversion efficiency and high reliability through the use of an improved rear reflective layer and a method for producing the same, and also provides a secondary battery, an artificial satellite, a roofing material, a solar cell module, and an automobile or the like utilizing said photovoltaic device.

The present inventors have found that the conventional rear reflective layer has been associated with the following drawbacks:

(1) Loss of reflectance due to irregular texture of the metal layer:

On the metal surface with the irregular texture, the light is randomly reflected in various directions. However, measurement with an integrating sphere capable of collecting the reflected light in all directions indicates that the metal layer with irregular surface structure shows a considerable loss in reflectance, in comparison with the smooth metal layer. This tendency is particularly conspicuous with Al or Cu. For this reason it is not possible to effectively return the light, transmitted through the semiconductor layer, back to said semiconductor layer, and the conversion efficiency of the photovoltaic does not reach, therefore, the expected level;

(2) Metal diffusion into the transparent layer:

The deposition of the semiconductor layer on the rear reflective layer is usually conducted with a substrate temperature of 200° C. or higher. At such temperature, the metal atoms of the rear reflective layer penetrate the overlying transparent layer and diffuse to the surface thereof. Such direct contact of the metal with the semiconductor layer results in insufficient function of the transparent layer, leading eventually to lowered reliability;

(3) Metal diffusion to the semiconductor layer:

In the formation of the transparent layer over the rear reflective layer, the underlying metal layer may be locally exposed. Such phenomenon is encountered particularly when the irregular texture of the metal layer is enlarged and the transparent layer is made thinner. If the semiconductor layer is deposited thereon, the metal atoms diffuse from the exposed area of the metal layer to the semiconductor layer, thus affecting the properties of the semiconductor junction;

(4) Drawbacks in the subsequent steps:

The semiconductor layer contains defects such as pinholes, through which direct contact can be formed between the upper electrode on the semiconductor layer and the underlying transparent layer. Excessive current will result in such directly contacting portions, unless the transparent layer has a suitable resistance.

Also, if the metal layer has an exposed portion as mentioned in (3), there may result direct contact between the upper electrode and the rear electrode through defects, such as pinholes, of the semiconductor layer.

Through the investigation of these drawbacks, the present inventors have reached the basic concept of the present invention, to be explained in the following. There is provided a photovoltaic device comprising a metal layer having a substantially smooth surface for reflecting light, a transparent layer provided on said surface and having an irregular surface at a side opposite to said smooth surface, a photoelectric conversion layer consisting of a semiconductor and provided on said transparent layer, and a transparent electrode layer provided on said photoelectric conversion layer, wherein said transparent layer is composed of plural layers, and a layer provided in contact with said metal layer having an irregular surface at the side of said photoelectric conversion layer.

Also, there is provided a photovoltaic device wherein said transparent layer is composed of plural layers, in which a layer provided in contact with said metal layer has a substantially smooth surface at the side of said photoelectric conversion layer and at least another of said layers has an irregular surface at the side of said photoelectric conversion layer.

FIG. 1 shows an example of the configuration of the photovoltaic device of the present invention. On conductive substrate 101, there is formed metal layer 102 of high reflectance. The metal layer 102 may be dispensed with if the substrate itself is composed of a material of sufficiently high reflectance.

Figure 2:
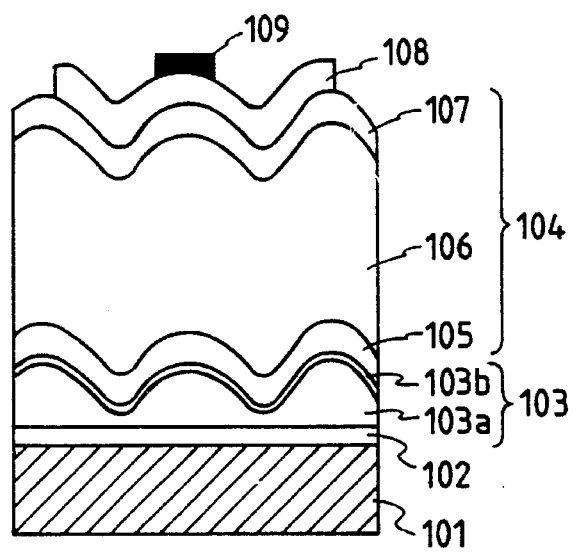
FIG. 2 is a schematic cross-sectional view of an embodiment of the photovoltaic device of the present invention, wherein a first layer has an irregular texture.
Figure 3:
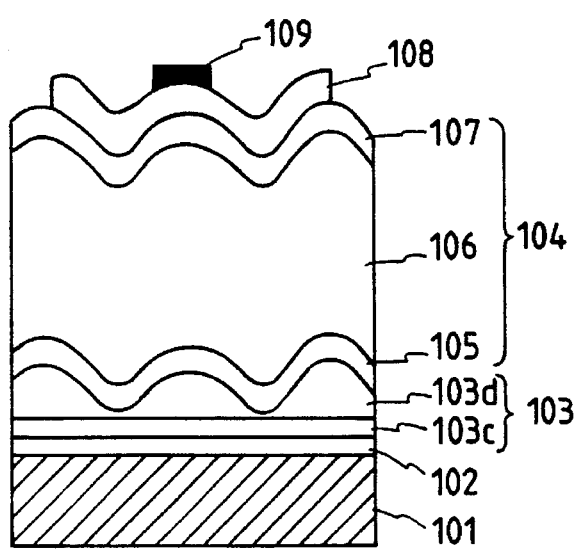
FIG. 3 is a schematic cross-sectional view of an embodiment of the photovoltaic device of the present invention, wherein a second layer has an irregular texture.
Figure 4A:
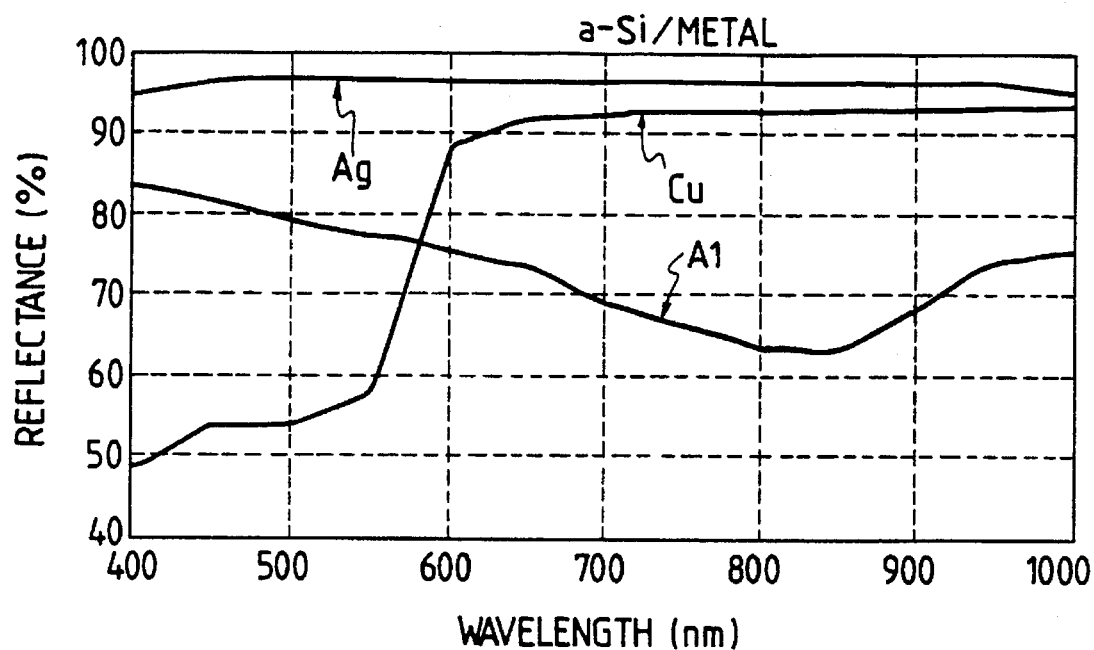
FIGS. 4A and 4B are graphs showing the effect of ZnO on reflectance at the interface between silicon and metal, in the absence (FIG. 4A) and presence (FIG. 4B) of ZnO.
Figure 4B:
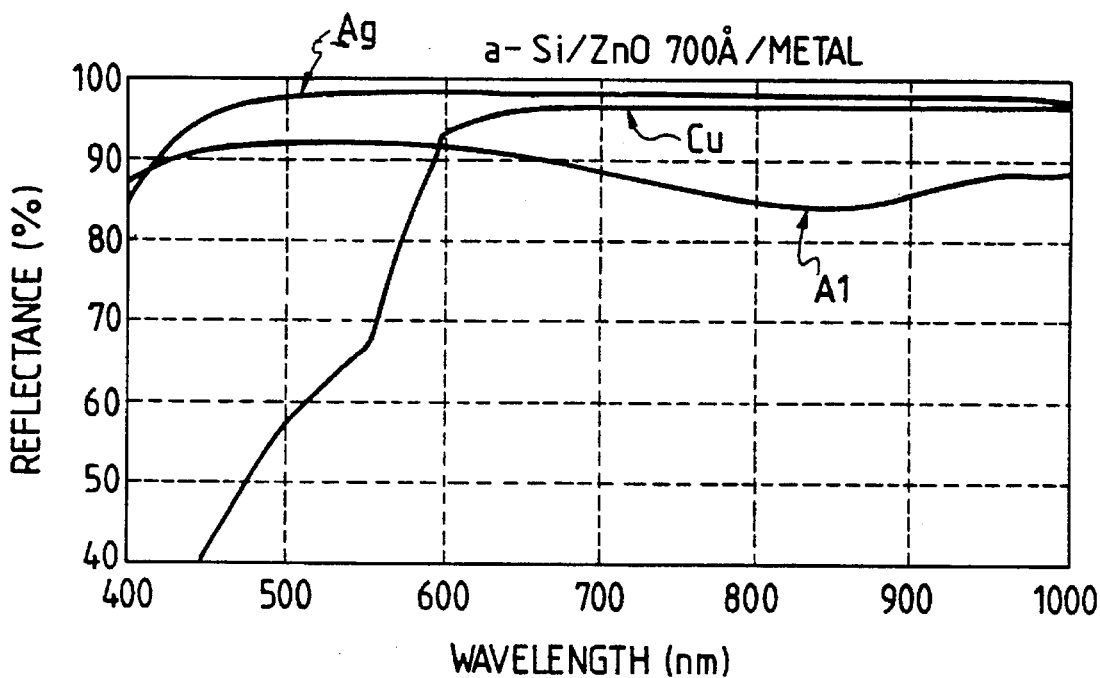
Figure 5:
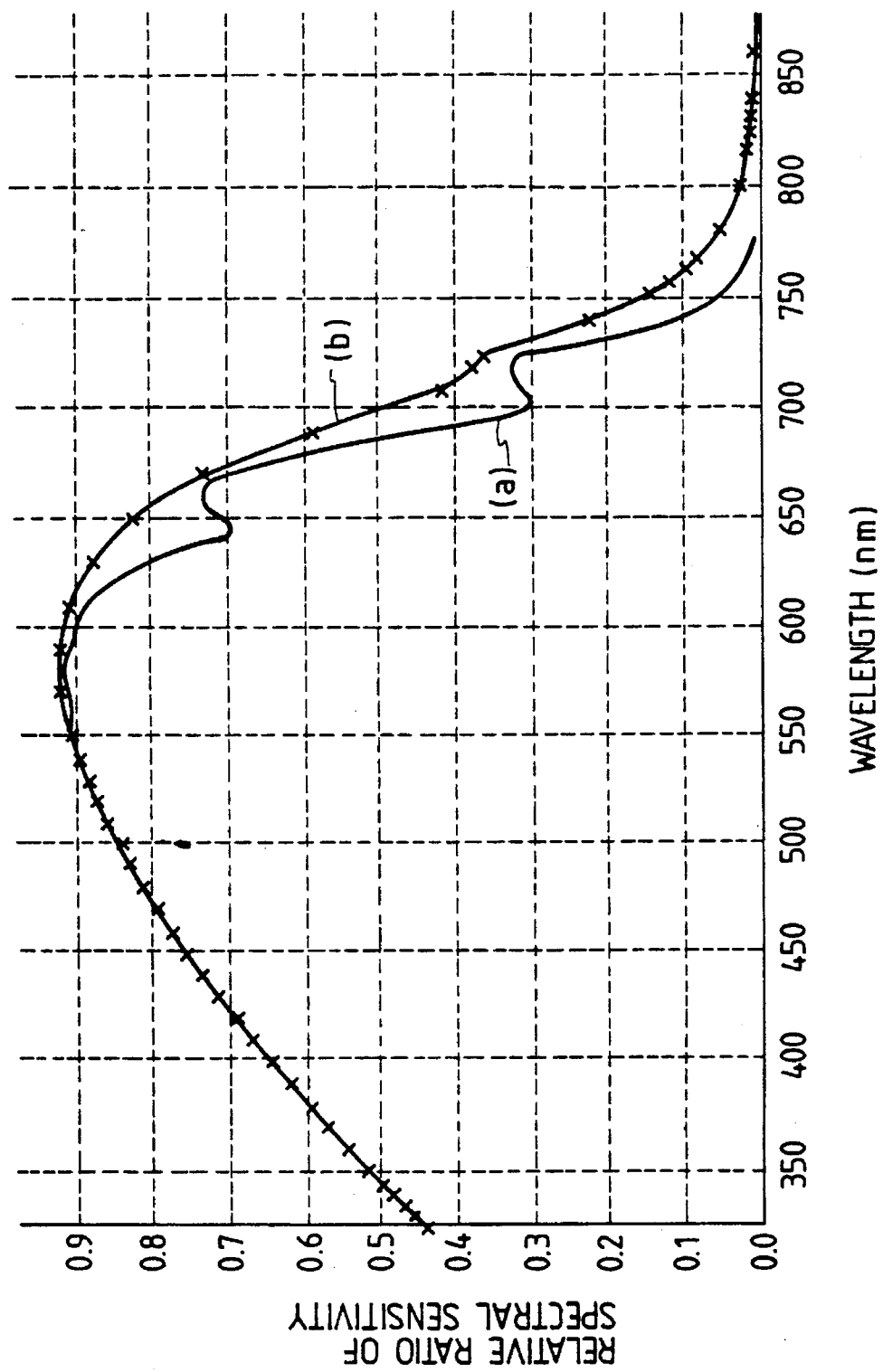
FIG. 5 is a chart showing the improvement in spectral sensitivity of a photovoltaic device by an irregular surface texture.

The surface of the metal layer 102 is a smooth surface with a flatness not affecting the specific reflectance of the metal itself, namely the magnitude of any irregularities does not exceed 1000 Å. Transparent layer 103 is formed thereon. It is transparent to the light transmitted by the photoelectric conversion layer, has a suitable electric resistance, and has an irregular surface structure. In the case where the transparent layer contains plural layers (FIG. 2 showing an example in which the transparent layer has a two-layered structure composed of first layer 103a and second layer 103b), the surface of the first layer 103a has an irregular surface structure with the magnitude of irregularities being in the range of 500 to 20,000 Å and the pitch of irregularities being in the range of 3000 to 20,000 Å. The second layer 103b formed thereon may have a considerably higher specific resistivity than the first layer 103a. In such case, however, the second layer 103b has to be as thin as possible, in order to reduce the resistance per unit area of the photovoltaic device. In the case where the transparent layer is composed of a plural layers (FIG. 3 showing an example with a two-layered structure composed of first layer 103c and second layer 103d) wherein the first layer 103c has a smooth light-receiving surface with the pitch of the irregularities not exceeding 3000 Å and has a suitable electrical resistance while the second layer 103d is subjected, for the formation of surface irregularities, to the action of an aqueous solution of acid, alkali, or salt as will be explained later, there is employed first layer 103c less eroded by said aqueous solution than second layer 103d. The second layer 103d has an irregular surface structure with a pitch of irregularities of 3000 to 20,000 Å and a height of irregularities of 500 to 20,000 Å, and has light transmission characteristics and electrical properties similar to those of the first layer.

Said transparent layer also has chemical resistance to the etchant or the like to be employed in the subsequent steps. Semiconductor junction 104 is provided thereon. As an example of the semiconductor junction, there is illustrated a PIN a-Si photovoltaic device, consisting of n-type a-Si layer 105, i-type a-Si layer 106, and p-type a-Si layer 107. If the semiconductor junction layer 104 is thin, the entire layer often assumes an irregular structure similar to that of the transparent layer 103, as illustrated in FIGS. 1, 2, and 3. Transparent electrode 108 is formed thereon, and comb-shaped current-collecting electrode 109 is provided thereon.

The above-mentioned configuration provides the following advantages:

(1) Because the surface of the metal layer 102 (or the substrate 101 itself) is smooth, the light reflectance on the metal surface is elevated. Besides, the irregular surface structure of the transparent layer 103 (and of the semiconductor junction layer 104) induces light scattering, due to the phase difference at the peaks and valleys of the irregularities, at the interface with said transparent layer, thereby causing a light trapping effect inside the semiconductor junction layer 104. For this reason the incident light is effectively absorbed, and the conversion efficiency of the photovoltaic device is improved;

(2) The smooth surface of the metal layer 102 (or the substrate 101 itself) reduces the contact area with the transparent layer 103, thereby reducing the diffusion of the metal atoms into the transparent layer 103.

Also, since the transparent layer 103 has an appropriate electrical resistance, excessive current is not generated even if the photoelectric conversion layer 104 develops defects. Further, as the transparent layer 103 is chemically resistant, the rear reflective layer is damaged less in the subsequent process;

(3) Even if the metal layer 102 is partially exposed in the formation of the irregular surface structure on the first layer 103a, the probability of contact between the upper electrode and the metal layer 102 is drastically reduced because of the covering by the second layer 103b, whereby the reliability of the photovoltaic device is significantly improved;

(4) Also, since the smooth first layer 103c is deposited on the smooth metal layer 102, the frequency of partial exposure of the metal layer 102, that can be encountered when the metal layer is given the irregular surface structure, is extremely reduced, whereby the diffusion of the metal atoms from the metal layer 102 to the semiconductor layer 104 can be prevented;

(5) Also, since the smooth first layer 103c is deposited on the smooth metal layer 102, the frequency of partial exposure of the metal layer 102, that can be encountered when the metal layer has an irregular surface structure, is extremely reduced, whereby a photoelectric device of high reliability is obtained, with little contact between the upper electrode and the metal layer.

In the following there will be explained experiments for verifying the effects of the present invention.

Experiment 1

On a 5×5 cm stainless steel plate (SUS 430), Al was deposited to a thickness of 1500 Å by DC magnetron sputtering, with the substrate at room temperature. Then ZnO was deposited to a thickness of 4000 Å by DC magnetron sputtering, with a substrate temperature of 250° C. Under SEM observation, the Al surface was smooth and lustrous, while the ZnO surface was turbid, showing concentrated crater-shaped recesses with diameters in a range of 4000 to 6000 Å. In this state the light reflectance was measured within a wavelength range of 6000 to 9000 Å. On the thus-formed rear reflective layer, there was formed a semiconductor junction layer, by means of glow discharge decomposition, an n-type a-Si layer of a thickness of 200 Å utilizing $SiH_4$ and $PH_3$ as the raw material gases, an i-type a-Si layer of a thickness of 4000 Å utilizing $SiH_4$ as the raw material gas, and a p-type microcrystalline (μc) Si layer of a thickness of 100 Å utilizing $SiH_4$, $BF_3$, and $H_2$ as the raw material gases. (Amorphous silicon obtained by glow discharge decomposition of $SiH_4$, etc. is generally written as a-Si:H because it contains hydrogen in about 10%, but, in the present text, it is represented as a-Si for the purpose of simplicity.) An ITO film of a thickness of 650 Å was deposited thereon by resistance-heated vapor deposition, and a current-collecting electrode of a width of 300 microns was formed thereon by silver paste, thereby obtaining Sample 1a.

Sample 1b was prepared in the identical manner as Sample 1a, except that the Al deposition was conducted with a substrate temperature of 300° C.

Also, Sample 1c was prepared in the identical manner as Sample 1a, except that the ZnO was conducted with the substrate at the room temperature.

Also, Sample 1d was prepared in the identical manner as Sample 1a, except that the stainless steel substrate was employed without deposition of Al or ZnO.

Also, Sample 1e was prepared in the identical manner as Sample 1a, except that the stainless steel substrate was replaced by an Al substrate of the same size, the surface of which was polished to a pitch of irregularities of about 1000 Å and Al deposition was not conducted.

The five samples thus obtained were subjected to the measurement of conversion efficiency as photoelectric conversion devices, in a solar simulator of AM-1.5 light. The obtained results are shown in Table 1, from which the following conclusions can be deduced:

(1) The conversion efficiency is improved with any rear reflective layer, in comparison with the absence of the rear reflective layer;

(2) The highest efficiency with a rear reflective layer is obtained when the Al layer had a smooth surface and the ZnO layer had an irregular surface texture; and (3) The polished Al substrate has an equivalent effect as the smooth Al layer.

Experiment 2

Sample 2a was obtained in the same manner as Sample 1a in Experiment 1, except that Al was replaced by Ag and the current-collecting electrode was not formed.

Also, Sample 2b was prepared in the same manner as Sample 2a, except that the Ag deposition was conducted with a substrate temperature of 350° C. instead of room temperature.

In Sample 2a, the entire rear reflective layer lacked lustre because the ZnO layer had an irregular surface structure although the Ag surface was smooth. In Sample 2b, the Ag surface had an irregular structure.

Table 2 shows the results of measurement of the conversion efficiency of both samples in a solar simulator of AM-1.5 light. Sample 2b showed a very low conversion efficiency, which is attributed to a short-circuiting, in consideration of the current-voltage characteristics. Also, in the SEM observation of both samples, Sample 2b showed scattered spot-shaped defects, and Auger analysis of these defect locations indicated Ag diffusion to the surface.

Experiment 3

Sample 3a was prepared in the same manner as Sample 1a in Experiment 1, except that a-Si deposition was conducted in a deposition chamber which had been used for film deposition for a prolonged period without chamber cleaning.

Also, Sample 3b was prepared in the same manner as Sample 3a, except that the ZnO deposition was conducted with a ZnO target containing 0.5% of Cu.

Table 3 shows the results of measurement of the conversion efficiency of both samples in a solar simulator of AM-1.5 light. Both samples showed lower conversion efficiencies than in Sample 1a, under the influence of short-circuiting, particularly conspicuous in Sample 3a. In the SEM observation, both samples showed many pinholes in the a-Si layer. For reference, the resistivity of ZnO, measured by forming a chromium (Cr) electrode directly on the surface of the rear reflective layer and providing a weak current, was $5 \times 10^2$ Ωcm in Sample 3a and $2 \times 10^5$ Ωcm in Sample 3b. It is therefore considered that, in Sample 3b, the specific resistivity of ZnO was suitably elevated, thereby suppressing the current in the pinholes.

Experiment 4

Sample 4a was prepared in the same manner as the rear reflective layer of Sample 1a in Experiment 1, except that the ZnO deposition was conducted with a ZnO target containing 0.5% of Cu. Also the rear reflective layer of Sample 1a was taken as Sample 4b. Both samples were immersed, for 5 minutes, in a 30% aqueous solution of ferric chloride, which is the etchant employed for ITO patterning. Sample 4a did not show any particular change, but, in Sample 4b, ZnO was significantly corroded. From these results it is expected that the rear reflective layer of Sample 4a is less prone to be damaged in the subsequent steps, even if the thin semiconductor films have defects such as pinholes.

Experiment 5

Sample 5 was prepared in the same manner as Sample 1a in Experiment 1, except that the deposition of the i-type a-Si layer was conducted with a tripled power of glow discharge and with a ⅓ flow rate of $SiH_4$, combined with deposition conditions so regulated as to obtain a film thickness of 4000 Å. The SEM observation of Samples 1a, 5 and of the rear reflective layers employed thereon provided the following results. The surface of Sample 1a showed concentrated crater-shaped recesses with diameters of 4000 to 6000 Å on the surface of the rear reflective layer, with almost the same depth of craters on both surfaces. On the other hand, the surface of Sample 5 showed heaved structures of a pitch finer than the recesses on the rear reflective layer, apparently indicating an aspect different from the structure of the rear reflective layer.

In an evaluation in the solar simulator, Sample 5 showed a conversion efficiency of 8.2%, lower than that of Sample 1a. This difference is principally due to a low short-circuit photocurrent, indicating an insufficient phototrapping effect in the case where, as in Sample 5, the upper surface structure of the semiconductor layer is different from that of the rear reflective layer.

Experiment 6

On a 5×5 cm stainless steel plate (SUS 430), Al was deposited to a thickness of 1500 Å by DC magnetron sputtering, with the substrate at room temperature. Then ZnO was deposited thereon to a thickness of 4000 Å by magnetron sputtering, with a substrate temperature of 300° C. Under SEM observation, the Al surface was lustrous and smooth with a pitch of irregularities of 1000 Å or less, while the ZnO surface was turbid, with concentrated crater-shaped recesses of diameters of 4000 to 9000 Å.

The height of the irregularities was about 2000 to 4000 Å. ZnO was further deposited thereon to a thickness of 500 Å, by magnetron sputtering with the substrate at room temperature. Under SEM observation, this layer exhibited an irregular surface structure similar to that of the first layer formed with the substrate temperature of 300° C. In this state the light reflectance was measured in a wavelength range of 6000 to 9000 Å. Subsequently, there were formed thereon a semiconductor junction, a transparent electrode, and a current-collecting electrode to obtain Sample 6a.

Also, Sample 6b was prepared in the same manner as Sample 6a, except that the Al deposition was conducted with a substrate temperature of 100° C.

Also, Sample 6c was prepared in the same manner as Sample 6a, except that the ZnO of the second layer (at the side of the semiconductor layer) was not deposited.

Also, Sample 6d was prepared in the same manner as Sample 6a, except that ZnO of the first layer was deposited to a thickness of 4500 Å with a substrate temperature of 300° C., and ZnO of the second layer was not deposited.

Also, Sample 6e was prepared in the same manner as Sample 6a, except that ZnO of the first layer was deposited to a thickness of 4000 Å with the substrate at room temperature, and ZnO of the second layer was not deposited.

Also, Sample 6f was prepared in the same manner as Sample 6a, except that ZnO of the first layer was deposited to a thickness of 4500 Å with the substrate at room temperature, and ZnO of the second layer was not deposited.

Also, Sample 6g was prepared in the same manner as Sample 6a, except that the stainless steel substrate was replaced by an Al substrate of the same size, the surface of which was polished to a pitch of irregularities of about 1000 Å.

The seven samples thus prepared were subjected to the measurement of conversion efficiency as solar cells, as an example of the photovoltaic device, in a solar simulator of AM-1.5 light. The obtained results are shown in Table 4, from which the following conclusions are deduced:

(1) The conversion efficiency was improved when a smooth metal layer (pitch of irregularities not exceeding 1000 Å) was combined with a transparent layer with an irregular surface structure (Samples 6a, 6c, 6d, and 6g); and (2) Samples 6a, 6c, 6d, and 6g were substantially the same in conversion efficiency, but the one-layered transparent layer (6c, 6d) and the two-layered transparent layer (6a, 6g) respectively provided yields of photovoltaic devices of about 70% and about 95%, with apparently improved reliability in the two-layered structure (said yield being calculated by the shunt resistance per unit area (1 cm$^2$), determined from the measurement of the current-voltage characteristics of each sample, each sample being rated as acceptable if said shunt resistance is equal to 200 Ωcm or higher and not acceptable below 200 Ωcm).

This difference is presumably due to the following phenomena. In the one-layered structure, in the formation of irregular structures in the transparent layer, the recesses locally grew larger, thus partially exposing the metal layer and causing electrical short-circuiting through such exposed areas when the photovoltaic device is formed. On the other hand, in the two-layered structure, said exposed areas are effectively covered by the second layer, whereby the frequency of the short-circuiting is reduced and the yield is increased.

Experiment 7

Sample 7a was prepared in the same manner as Sample 6a in Experiment 6, except that ZnO of the first layer was deposited to a thickness of 10,000 Å and the substrate was thereafter immersed in 10% aqueous solution of acetic acid for 1 minute at room temperature.

Also, Sample 7b was prepared in the same manner as Sample 7a except that ZnO of the first layer had a thickness of 25,000 Å.

Also, Sample 7c was prepared in the same manner as Sample 7b, except that the immersion of the substrate in 10% aqueous acetic acid solution was conducted for 90 seconds.

Also, Sample 7d was prepared in the same manner as Sample 7b, except that the immersion of the substrate in 10% aqueous acetic acid solution was conducted for 3 minutes.

SEM observation showed that the magnitude of the irregular structure of the first layer of ZnO transparent layer grew with the immersion time, due to the etching action of the acetic acid solution.

Under SEM observation, Samples 7a and 7d showed locally exposed areas of the metal layer immediately after immersion in the acetic acid solution, but such local exposures of the metal layer could no longer be observed after the deposition of the second layer of the ZnO transparent layer. Table 5 shows the results of measurement of conversion efficiency of the four samples under AM-1.5 light. Samples 7a, 7b and 7c showed high conversion efficiencies but Sample 7d did not show such high conversion efficiency.

Experiment 8

Sample 8a was prepared in the same manner as Sample 6a, except that the deposition of the transparent layer was not conducted.

Under AM-1.5 light, Sample 8a showed a conversion efficiency of 2.2%. Auger microanalysis of the a-Si layer of Sample 8a detected aluminum atoms.

It was therefore confirmed that the direct contact between the metal layer and the semiconductor layer induced diffusion of metal atoms into the semiconductor layer.

Experiment 9

On a 5×5 cm stainless steel substrate (SUS 430), Al was deposited to a thickness of 1500 Å by DC magnetron sputtering, with the substrate at room temperature. Then ZnO was deposited to a thickness of 1000 Å by DC magnetron sputtering, also with the substrate at room temperature. Under SEM observation, the Al surface was a lustrous smooth surface with a pitch of irregularities of 1000 Å or less. Also, the ZnO layer had a lustrous smooth surface, though yellowish, with a pitch of irregularities of 1000 Å or less. Then, ZnO was deposited thereon to a thickness of 3000 Å by DC magnetron sputtering, with a substrate temperature of 300° C. Under SEM observation, the ZnO film constituting the second layer had a turbid surface, with a pitch of irregularities of 4000 to 8000 Å and a magnitude of irregularities of 2000 to 3000 Å. In this state, the light reflectance was measured in a wavelength range of 6000 to 9000 Å.

Subsequently, there were formed thereon a semiconductor junction, a transparent electrode, and a current-collecting electrode in the same manner as in Experiment 1, whereby Sample 9a was obtained.

Also, Sample 9b was prepared in the same manner as Sample 9a, except that the Al deposition was conducted with a substrate temperature of 100° C.

Also, Sample 9c was prepared in the same manner as Sample 9a, except that ZnO of the second layer was not deposited.

Also, Sample 9d was prepared in the same manner as Sample 9a, except that ZnO of the first layer was deposited to a thickness of 4000 Å with the substrate at room temperature and ZnO of the second layer was not deposited.

Also, Sample 9e was prepared in the same manner as Sample 9a, except that ZnO of the first layer was deposited to a thickness of 4000 Å with a substrate temperature of 300° C. and the second ZnO layer was not deposited.

Also, Sample 9f was prepared in the same manner as Sample 9a, except that the stainless steel substrate was replaced by an Al substrate of the same size, the surface of which was polished to a pitch of irregularities of 1000 Å or less, and Al deposition was not conducted.

The six samples thus obtained were subjected to the measurement of conversion efficiency as solar cells, as an example of the photovoltaic device, in a solar simulator of AM-1.5 light. The obtained results are shown in Table 6, from which the following conclusions were deduced:

(1) The conversion efficiency was improved by the use of a rear reflective layer, composed of a combination of a smooth metal layer and a transparent layer with irregular surface structure (Samples 9a, 9e, and 9f);

(2) Although Samples 9a, 9e, and 9f were almost the same in conversion efficiency, the one-layered transparent layer (Sample 9e) provided a yield of the photovoltaic devices of about 70% while Samples 9a and 9f with the two-layered transparent layer provided yields of about 95%. Thus the two-layered structure was apparently higher in yield and reliability. (Said yield was calculated by the shunt resistance per unit area (1 cm$^2$), determined from the measurement of the current-voltage characteristics of each sample, and each sample was rated as acceptable if said shunt resistance is equal to 200 Ωcm and not acceptable below 200 Ωcm.) This difference is presumably due to the following phenomena. In the one-layered structure, in the formation of irregular structure in the transparent layer, the recesses locally grew larger, thus partially exposing the metal layer and causing electrical short-circuiting between thus-exposed areas and the upper electrode through defects such as pinholes in the semiconductor layer formed thereon. On the other hand, the use of a two-layered transparent layer in which the first layer has a smooth surface drastically reduces the formation of said exposed areas, thereby reducing the formation of electrical short-circuits and improving the yield.

Experiment 10

Sample 10a was prepared in the same manner as Sample 9a, except that Al in Experiment 9 was replaced by Ag and the current-collecting electrode was not formed.

Also, Sample 10b was prepared in the same manner as Sample 10a, except that the Ag deposition was conducted with a substrate temperature of 300° C. instead of room temperature.

In Sample 10a, the rear reflective layer lacked lustre, because the ZnO had an irregular surface structure through the Ag had a smooth surface. In Sample 10b, the Ag surface showed an irregular structure.

Table 7 shows the result of measurement of conversion efficiency under AM-1.5 light of both samples. Sample 10b showed a significantly low conversion efficiency, presumably due to short-circuiting, based on the current-voltage characteristics. Under SEM observation of both samples, Sample 10b showed scattered spot-shaped defects, and Auger analysis of these defects revealed Ag diffusion to the surface.

Experiment 11

In the process of Experiment 9, $SnO_2$ was deposited as the first layer to a thickness of 1000 Å by DC magnetron sputtering, with a substrate temperature of 200° C. The $SnO_2$ showed a lustrous smooth surface, with a pitch of irregularities not exceeding 1000 Å. Then ZnO was deposited thereon, as the second layer, with a thickness of 10,000 Å, with a substrate temperature of 300° C. Sample 11a was obtained by a subsequent process same as that for Sample 9a, except that the substrate surface was immersed in a 20% aqueous solution of perchloric acid for 30 seconds at room temperature.

Also, Sample 11b was obtained in the same manner as Sample 11a, except that the immersion of the substrate surface in the 20% aqueous solution of perchloric acid was conducted for 45 seconds.

Also, Sample 11c was prepared in the same manner as Sample 11a, except that ZnO of the second layer was deposited to a thickness of 25,000 Å.

Also, Sample 11d was prepared in the same manner as Sample 11c, except that the immersion of the substrate surface in the 20% aqueous solution of perchloric acid was conducted for 45 seconds.

Also, Sample 11e was prepared in the same manner as Sample 11c, except that the immersion of the substrate surface in the 20% aqueous solution of perchloric acid was conducted for 90 seconds.

SEM observation showed that the irregularities of the irregular surface structure of ZnO constituting the second layer grew larger with the immersion time, by the etching action of the aqueous perchloric acid solution.

In comparison with the irregularities of Sample 11d, those of Sample 11b are smaller. This is presumably due to the weaker action of the aqueous perchloric acid solution to $SnO_2$ than to ZnO.

Table 8 shows the result of measurement of conversion efficiency of these five samples under AM-1.5 light. Although Samples 11a to 11d showed high conversion efficiencies, Sample 11e did not show a high conversion efficiency.

In the following there will be given a detailed explanation of the rear reflective layer employed in the photovoltaic device of the present invention.

Substrate and metal layer

Various metals can be employed as the substrate. In particular, stainless steel plate, zincated steel plate, aluminum plate, and copper plate are preferred because of the relatively low cost. The metal plate may be cut into a predetermined shape, or may be employed as a continuous web, depending on the thickness. The latter form, being windable into a coil, is suitable for continuous production, and facilitates storage and transportation. Also, for certain applications there may be employed a crystalline substrate such as of silicon, or a plate of glass or ceramics. The substrate surface may be polished, or it may be used without polishing if the surface finish is satisfactory, as in bright annealed stainless steel plate.

A substrate with a low light reflectance such as stainless steel plate or zincated steel plate, or a substrate with a low conductivity such as glass or ceramic plate can be used as the substrate of the present invention, by forming thereon a metal layer of high reflectance such as of silver, aluminum, or copper. However, since the shorter wavelength component in the solar light spectrum is already absorbed by the semiconductor layer, the rear reflective layer needs only to have a high reflectance of the light of the longer wavelength region. The shortest boundary wavelength of such high reflectance region depends on the optical absorption coefficient and the thickness of the semiconductor material to be employed. As an example, in the case of a-Si with a thickness of 4000 Å, said boundary wavelength is about 6000 Å, so that copper can be advantageously used.

Figure 6:
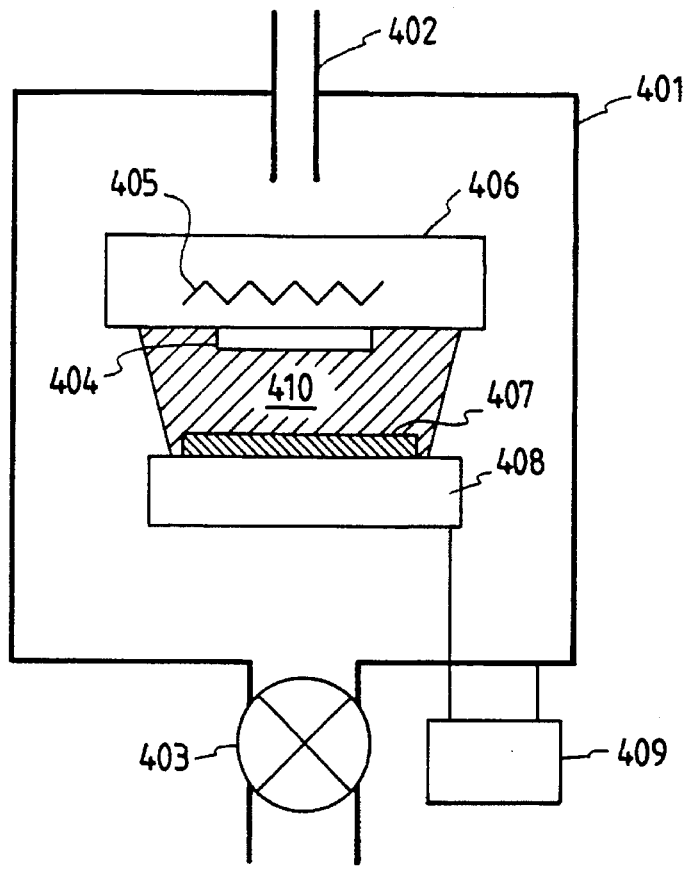
FIG. 6 is a schematic cross-sectional view of a sputtering apparatus, adapted for producing the rear reflective layer of the present invention.

The metal layer deposition, if employed, can be achieved, for example, by vacuum evaporation by means of resistance heating or with an electron beam, sputtering, ion plating, CVD, or plating. Sputtering will be explained in the following, as an example of a film forming method. FIG. 6 shows an example of the sputtering apparatus, in which deposition chamber 401 can be evacuated by a vacuum pump (not shown). Inert gas, such as argon (Ar), is introduced into said chamber, with a predetermined flow rate from gas supply pipe 402 connected to a gas cylinder (not shown), and the interior of the deposition chamber 401 is maintained at a predetermined pressure by the adjustment of the aperture of exhaust valve 403. Substrate 404 is fixed on anode 406, containing heater 405 therein. Opposed to the anode 406 there is provided cathode 408, supporting thereon target 407, which is a block of the metal to be deposited. It is usually composed of the metal of a purity of 99.9 to 99.999%, but a specific impurity may be contained in certain cases. The cathode is connected to power source 409, which applies an RF (radio frequency) or DC high voltage, thereby generating plasma 410 between the cathode and the anode. The metal atoms of the target 407 are deposited onto the substrate 404, by the action of said plasma. A higher deposition rate can be obtained in a magnetron sputtering apparatus in which a magnet is provided in the cathode 408 for increasing the plasma intensity.

An example of the depositing conditions is as follows. There were employed an Al target of a purity of 99.99% and a diameter of 6 inches; a substrate consisting of stainless steel plate (SUS 430) of a size of 5×5 cm and a thickness of 1 mm, with a polished surface; a distance of 5 cm between the target and the substrate; and a flow rate of Ar of 10 sccm, with a pressure of 1.5 mTorr. A DC voltage of 500 V generated plasma with a current of 2 A, and the discharge was maintained in this state for 1 minute. Samples 13a, 13b, 13c, and 13d were obtained respectively at substrate temperatures of room temperature, 100° C., 200° C., and 300° C. Table 9 summarizes the appearance and the result of SEM observation of these samples. The Al surface apparently varied from smooth surface to irregular surface, with the increase in temperature. A similar tendency is generally observed with other metals and in other film forming methods.

Transparent Layer and its Irregular Structure

The transparent layer is often composed of oxides such as ZnO, $In_2O_3$, $SnO_2$, CdO, $CdSnO_4$, or TiO, though the actual composition of these compounds does not necessarily coincide with that of the chemical formula. The optical transmittance of the transparent layer should preferably be as high as possible, but it need not be transparent to the light of the wavelength region which is absorbed by the semiconductor, or which is not absorbed by the semiconductor. The transparent layer should preferably have a certain electrical resistance in order to suppress the short-circuit current generated, for example, by the pinholes, but said resistance should be such that it causes negligible influence on the series resistance loss of the conversion efficiency of the photovoltaic device. Based on these considerations, the resistance per unit area (1 cm$^2$) of the transparent layer should preferably within a range from $10^6$ to 10 Ω, more preferably from $10^{-5}$ to 3 Ω, and most preferably from $10^4$ to 1 Ω. Also, the thickness of the transparent layer is preferably as small as possible in consideration of the transparency, but should be at least 500 Å in consideration of multiple interference effects. Also, the average thickness should be at least 1000 Å for forming the irregular surface structure. A larger film thickness may be required in consideration of the reliability. In the case of plural layers, an average film thickness of at least 1000 Å is required in order to form the irregular surface structure in the first layer.

The irregular structure can be formed in the first layer by elevating the temperature during the deposition of the layer in contact with the metal layer. In this case, the temperature T1 for forming the first layer varies suitably according to the material and apparatus employed in said formation, but is preferably higher than 200° C. in the DC magnetron sputtering employing a ZnO target (purity 99.9%). Also, since the irregular surface structure of oxide or the like employed in said transparent layer grows as the forming temperature becomes higher, there is employed a relation T1>Tn wherein Tn is the forming temperature of the n-th layer.

An alternative method for forming the irregular structure consists, after formation of the first layer, of immersing the surface thereof in aqueous solution of acid, alkali, or salt. A desired irregular structure can be obtained by regulating the length of the immersion time. The frequently used examples of acid include acetic acid, sulfuric acid, hydrochloric acid, nitric acid, and perchloric acid, while those of alkali include sodium hydroxide, potassium hydroxide, and aluminum hydroxide, and those of salt include ferric chloride and aluminum chloride.

Another alternative method for forming the irregular structure consists, after formation of the first layer, of bombarding the surface of the transparent layer on which the irregular structure is to be formed, with plasma or ions, for example, by reverse sputtering. This method can be conducted in a relatively simple manner, and is suitable for batch processing. The second or any subsequent layer of the transparent layer should be of such thickness that it does not deteriorate the irregular structure formed by the first layer. Further, in consideration of the thickness of the semiconductor layer to be deposited thereon, said thickness is preferably within a range from 500 to 3000 Å, more preferably from 500 to 2500 Å, and most preferably from 500 to 2000 Å.

The forming temperature Tn of at least the n-th layer of the second and subsequent layers should be as low as possible, in order to form a smooth surface for completely covering the irregularities of the first layer. Said n-th forming temperature Tn varies suitably according to the material and apparatus employed in the formation of the n-th layer, but a condition Tn<200° C. is preferred, for example, in the DC magnetron sputtering employing a ZnO target (purity 99.9%).

Also, in another example composed of plural layers, the first forming temperature T1 is preferably as low as possible, as a method for forming a pitch of irregularities not exceeding 3000 Å in the first layer.

Said first forming temperature T1 varies according to the material and apparatus employed in the formation of the first layer, but a condition T1<200° C. is preferred, for example, in the DC magnetron sputtering employing a ZnO target (purity 99.9%).

Among the second and subsequent layers in the transparent layer, the n-th layer having the irregular surface structure should have an average thickness of 1000 Å or larger, in order to have such irregular structure. A method for forming said irregular structure consists of elevating the n-th forming temperature Tn. Said temperature Tn varies depending on the material and apparatus employed for the formation of the n-th layer, but a condition Tn>200° C. is preferred, for example, in the DC magnetron sputtering employing a ZnO target (purity 99.9%). Also, since the irregular surface structure of the oxide or the like employed in said transparent layer grows larger as the forming temperature T becomes higher, there is employed a relation T1<Tn.

An alternative method for forming the irregular structure consists, after the deposition of the n-th layer in which said irregular structure is to be formed, of immersing the surface thereof in an aqueous solution of acid, alkali, or salt. A desired irregular structure can be obtained by regulating the length of the immersion time. Examples of such acid include acetic acid, sulfuric acid, hydrochloric acid, nitric acid, and perchloric acid, while those of said alkali include sodium hydroxide, potassium hydroxide, and aluminum hydroxide, and those of said salt include ferric chloride and aluminum chloride.

Another alternative method for forming the irregular structure consists, after the deposition of a transparent layer in which the irregular structure is to be formed, of bombarding the surface thereof with plasma or ions, for example, to effect sputtering thereof. This method can be relatively easily conducted, and is suitable for batch processing.

Among the second and subsequent layers in the transparent layer, the n-th layer having said irregular structure and the subsequent layers deposited thereon should have a total thickness which does not deteriorate said irregular structure. Also, in consideration of the thickness of the semiconductor to be provided thereon, said total thickness is preferably within a range from 500 to 3000 Å, more preferably from 500 to 2500 Å, and most preferably from 500 to 2000 Å.

The transparent layer may be deposited by vacuum evaporation employing resistance heating or an electron beam, sputtering, ion plating, CVD, or spray coating. The sputtering method will be explained as an example of a film forming method. Also in this case, the sputtering apparatus shown in FIG. 6 may be employed. In the case of oxide deposition, however, there may be employed a target of the oxide itself or of a metal (Zn, Sn, etc.). In the latter case, oxygen must be supplied, together with argon, to the deposition chamber ("reactive" sputtering).

In the following there are shown examples of the conditions for deposition and irregular structure formation. There was employed a stainless steel plate (SUS 430) of a size of 5×5 cm and a thickness of 1 mm, with a polished surface, as the substrate. There was also employed a ZnO target of a diameter of 6 inches, with a purity of 99.9%, at distance of 5 cm between the target and the substrate. Argon was supplied at a flow rate of 10 sccm and maintained at a pressure of 1.5 mTorr, and a DC voltage of 500 V was applied to generate plasma, with a current of 1 A. The discharge was maintained in this state for 5 minutes.

Samples 14a, 14b, 14c, and 14d were obtained by respectively maintaining the substrate at room temperature, 100° C., 200° C., and 300° C. Table 10 summarizes the appearances and the results of SEM observation of these samples. The surface state of ZnO varied as the temperature was elevated. The turbid samples 14c and 14d showed crater-shaped recesses on the surface, which are assumed to be the cause of turbidity.

In the following there are shown examples of the conditions for deposition and irregular structure formulation, in the case of plural layers in which the first layer has an irregular surface structure.

There were employed the same conditions for 15 minutes. Samples 15a, 15b, 15c, and 15d were prepared by maintaining the substrate at the room temperature, 100° C., 200° C., and 300° C., respectively. The surface state of the ZnO varied as the temperature was elevated. The turbid Samples 15c and 15d showed crater-shaped recesses on the surface, which were considered as the cause of the turbidity. Additional Samples 15e and 15f were prepared by immersing the sample, prepared at a substrate temperature of 200° C., in a 10% aqueous solution of acetic acid for 1 and 1.5 minutes, respectively. Table 11 summarizes the appearances and the result of SEM observation of these samples.

Samples 15a to 15f thus prepared were again subjected to the deposition of ZnO by sputtering under the same conditions as above but with a discharge time of 1.5 minutes, whereby there was obtained a deposition film of an irregular surface structure substantially the same as that of Samples 15a to 15f.

In the following there are shown examples of the conditions for deposition and irregular structure formation, in the case of plural layers in which at least one of the second and subsequent layers has an irregular surface structure.

There were employed the same conditions as above, except that the discharge was continued for 1.5 minutes, with the substrate at room temperature.

Then ZnO of the second layer was deposited by similar sputtering, with a discharge time of 15 minutes. Samples 16a, 16b, 16c, and 16d were prepared by respectively maintaining the substrate at the room temperature, 100° C., 200° C., and 300° C. Table 12 summarizes the appearances and the result of SEM observation of these samples.

Light trapping can be attributed to light scattering in the metal layer in the case where the metal layer itself has the irregular structure, but to the scattering by aberration of the light phase between the peaks and valleys of the irregularities at the semiconductor surface and/or the interface between the semiconductor and the transparent layer, in the case where the metal layer is smooth and the transparent layer has the irregular surface structure. The pitch of irregularities is preferably in a range from 3000 to 20,000 Å, more preferably from 4000 to 15,000 Å, and the height of the irregularities is preferably in a range of 500 to 20,000 Å, more preferably from 700 to 10,000 Å. When the semiconductor surface has an irregular structure similar to that of the transparent layer, the scattering is facilitated by the phase difference, so that the light trapping effect is enhanced.

For controlling the specific resistivity of the transparent layer, there is preferably added a suitable impurity. In the transparent layer of the present invention, the resistance should preferably be suitably elevated by the addition of an impurity, since the aforementioned conductive oxides may have excessively low specific resistivities, and also for reducing the layer thickness. For example, an n-type semiconductor may be doped with an acceptor-type impurity (such as Cu to ZnO or Al to $SnO_2$) in a suitable amount, for achieving intrinsic character and elevating the resistance.

In the case where transparent layer is composed of plural layers, suitable impurities may be added respectively to said layers, but a suitable resistance of the entire transparent layer may be obtained by introducing the impurity in at least one layer.

Also, such an intrinsic transparent layer generally becomes more resistant to the etching by acid or alkali. There are therefore obtained additional advantages in that it is less attacked by the chemicals employed in the patterning of the semiconductor layer or the ITO layer in the subsequent steps of manufacture of the photovoltaic devices, and the durability of the photovoltaic device is improved under prolonged use under high temperature and high humidity.

However, such an intrinsic state of the transparent layer is undesirable as it deteriorates the processing efficiency, if etching with an aqueous solution of acid, alkali, or salt is employed for the formation of the irregular surface structure of the transparent layer. In such case, a photovoltaic device of a suitable resistance, with high chemical resistance and high durability, can be obtained by etching the transparent layer without impurity introduction and by then laminating another transparent layer of intrinsic state. The impurity addition to the transparent layer may be achieved by adding the desired impurity to the evaporation source or the target as explained in Experiments 3 and 4, or, in the case of sputtering, by placing a small piece of a material containing the impurity on the target.

Embodiment 1

In this embodiment, there was prepared a photovoltaic device of the PIN a-Si structure shown in FIG. 1 in which, however, the metal layer 102 was absent. On Al plate 101 of 5×5 cm and a thickness of 1 mm, with a polished surface, ZnO layer 103 with an average thickness of 4000 Å was deposited, in the apparatus shown in FIG. 6 employing a ZnO target containing 5% of Cu, with a substrate temperature of 250° C. The ZnO surface showed an irregular structure.

The substrate bearing the thus-formed lower electrode was placed in a commercial capacitance-coupled high-frequency CVD apparatus (Ulvac CHJ-3030), and the reaction chamber was evacuated roughly and then finely through a vacuum tub connected to a vacuum pump. The surface temperature of the structure was maintained at 250° C. by a temperature control mechanism. After sufficient evacuation, $SiH_4$ at 300 sccm, $SiF_4$ at 4 sccm, $PH_3/H_2$ (diluted to 1% with $H_2$) at 55 sccm, and $H_2$ at 40 sccm were introduced from gas supply tubes, and the internal pressure of the reaction chamber was maintained at 1 Torr by the regulation of a throttle valve. When the pressure was stabilized, electric power of 200 W was applied from a high-frequency power source, and the plasma was maintained for 5 minutes. Thus n-type a-Si layer 105 was formed on the transparent layer 103. After evacuation of the reaction chamber again, $SiH_4$ at 300 sccm, $SiF_4$ at 4 sccm, and $H_2$ at 40 sccm were introduced from the gas supply tubes, and the internal pressure of the reaction chamber was maintained at 1 Torr by the regulation of the throttle valve. When the pressure was stabilized, electric power of 150 W was applied from the high-frequency power source, and the plasma was maintained for 40 minutes. Thus i-type a-Si layer 106 was formed on the n-type a-Si layer 105. After subsequent evacuation of the reaction chamber again, $SiH_4$ at 50 sccm, $BF_3/H_3$ (diluted to 1% with $H_2$) at 50 sccm, and $H_2$ at 500 sccm were introduced from the gas supply pipes, and the internal pressure of the reaction chamber was maintained at 1 Torr by the regulation of the throttle valve. When the pressure was stabilized, electric power of 300 W was applied from the high-frequency power source, and the plasma was maintained for 2 minutes. Thus p-type μc-Si layer 107 was formed on the i-type a-Si layer 106. Subsequently the sample was taken out from the CVD apparatus, subjected to ITO deposition in a resistance-heated vacuum evaporation apparatus, then printing of a paste containing aqueous ferric chloride solution for patterning the transparent electrode 108 into desired shape, and screen printing of a silver paste for forming current-collecting electrode 109, whereby a photovoltaic device was completed. 10 samples were prepared in this manner and subjected to measurement of photoelectric conversion efficiency under irradiation of AM-1.5 light (100 $mW/cm^2$), whereby an excellent efficiency of 9.5±0.2% was reproducibly obtained. Also, these photovoltaic devices, after standing for 1000 hours under the conditions of a temperature of 50° C. and a relative humidity of 90%, showed a conversion efficiency of 9.2±0.5%, with almost no deterioration of the efficiency.

Embodiment 2

In this embodiment, a PIN a-SiGe photovoltaic device of the configuration shown in FIG. 1 was prepared. On surface-polished stainless steel plate 101 of 5×5 cm and a thickness of 1 mm, there was formed Cu layer 102 of a thickness of 1500 Å with a smooth surface by plating. Then Zn containing 1% of Cu was ion plated in an oxygen atmosphere with a substrate temperature of 350° C. to deposit a ZnO layer of an average thickness of 1μ with an irregular surface structure.

10 samples were prepared by a subsequent process the same as in Embodiment 1, except that the i-layer was composed of a-SiGe deposited by introducing $Si_2H_6$ at 50 sccm, $GeH_4$ at 10 sccm, and $H_2$ at 300 sccm, maintaining the internal pressure of the reaction chamber at 1 Torr, applying an electrical power of 100 W, and maintaining the plasma for 10 minutes. In measurement under AM-1.5 light (100 $mW/cm^2$), these devices showed excellent conversion efficiency of 8.5±0.3% in a reproducible manner.

Embodiment 3

Figure 7:
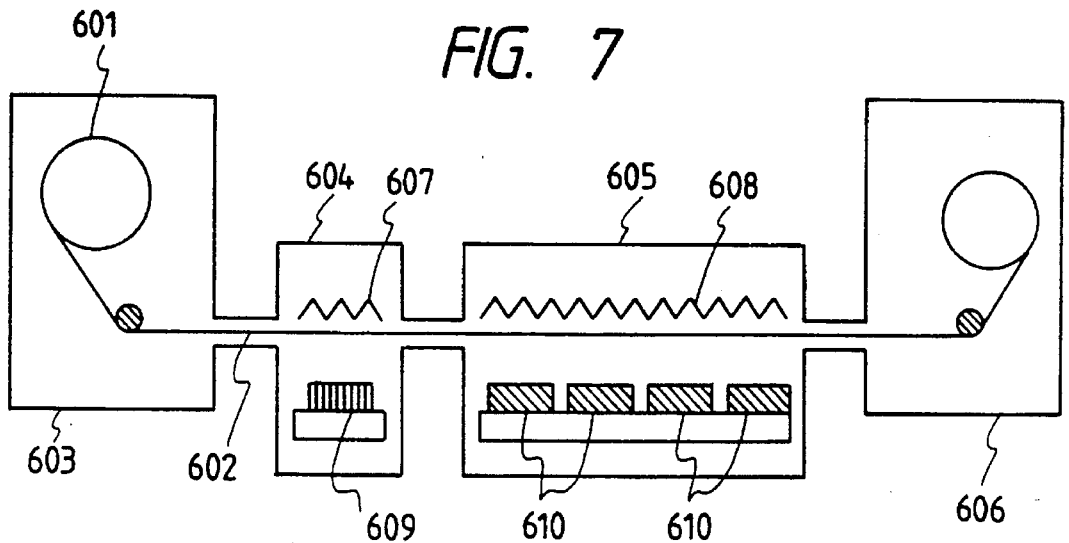
FIG. 7 is a view of a sputtering apparatus adapted for producing a rear reflective layer in the case where the transparent layer of the present invention consists solely of a first layer.

An apparatus shown in FIG. 7 was employed for forming the rear reflective layer in a continuous manner. In substrate feeding chamber 603, there was placed roll 601 of cleaned stainless steel sheet 602 of a width of 350 mm, a thickness of 0.2 mm and a length of 500 m. The stainless steel sheet 602 was fed therefrom to takeup chamber 606, through metal layer deposition chamber 604 and transparent layer deposition cheer 605. The sheet 602 could be heated to desired temperatures in respective deposition chambers by heaters 607, 608. The chamber 604 was equipped with target 609 composed of Al of a purity of 99.99%, for depositing Al onto the sheet 602 by DC magnetron sputtering. The chamber 605 was equipped with targets 610 of ZnO of a purity of 99.5%, containing 0.5% of Cu, for depositing a ZnO layer by DC magnetron sputtering. There were provided four targets 610 in consideration of the deposition rate and the desired film thickness.

The rear reflective layer was formed with this apparatus, at a sheet feeding speed of 20 cm/min, and with a substrate temperature of 250° C. at the ZnO deposition station, achieved by the heater 608 alone. Argon was supplied at a pressure of 1.5 mTorr, and a DC voltage of 500 V was applied to the cathodes. There were obtained a current of 6 A in the target 609 and a current of 4 A in each of the targets 610. On the taken-up sheet there were obtained an Al layer of a thickness of 1600 Å and a ZnO layer of average thickness of 3800 Å, with a turbid surface.

Figure 10:
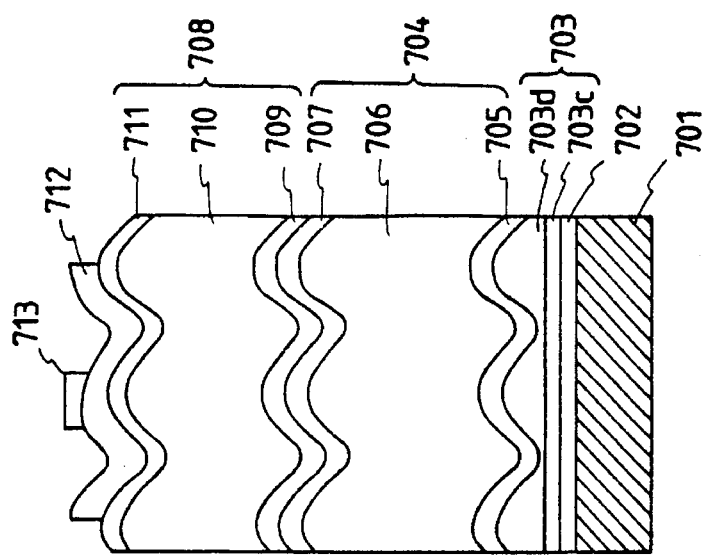
FIG. 10 is a schematic cross-sectional view of another embodiment of the photovoltaic device of the present invention, wherein the transparent layer is composed of a first layer only.

An a-Si/a-SiGe tandem photovoltaic device of the configuration shown in FIG. 10 was formed thereon. In FIG. 10 there are shown substrate 701; metal layer 702; transparent layer 703; bottom cell 704; top cell 708; n-type a-Si layers 705, 709; p-type μc-Si layers 707, 711; i-type a-SiGe layer 706; and i-type a-Si layer 710. These semiconductor layers were formed in continuous manner by a roll-to-roll film forming apparatus as disclosed in U.S. Pat. No. 4,492,181. Transparent electrode 712 was formed by a sputtering apparatus similar to that shown in FIG. 7. There is also provided a current-collecting electrode 713. After the patterning of the transparent electrode and the formation of the current-collecting electrodes, the sheet 602 was cut into pieces. Mass production was achieved by conducting the entire process in a continuous manner.

100 samples were prepared in this manner and evaluated under AM-1.5 light (100 mW/cm$^2$). There was obtained excellent conversion efficiency of 11.2±0.2% in a reproducible manner. After standing for 1000 hours under conditions of 50° C. temperature and 90% relative humidity, the conversion efficiency was 10.8±0.6%, with almost no change. Also another 100 samples, irradiated with light corresponding to AM-1.5 light for 600 hours in the open circuit state, showed conversion efficiency of 10.5±0.3%, indicating that the deterioration by light is also little. These results were based on the tandem structure which enabled effective absorption of the long wavelength region and attained a higher output voltage, and also based on the reduced deterioration of the semiconductor layer under light irradiation. Thus, in combination with the effect of the rear reflective layer of the present invention, there could be obtained a photovoltaic device of high reliability and a high conversion efficiency.

Embodiment 4

A rear reflective layer was formed in the same manner as in Embodiment 1, except that a surface polished Cu plate was employed as the substrate. On the thus-treated substrate and on a substrate without ZnO deposition, Cu and In were deposited by sputtering, with respective thicknesses of 0.2 and 0.4μ. The samples were then transferred to a quartz glass bell jar and heated to 400° C. therein, and hydrogen selenide (H$_2$Se) diluted to 10% with hydrogen was supplied therein to form a thin film of CuInSe$_2$ (CIS). Then a CdS layer of a thickness of 0.1μ was formed thereon by sputtering, and a p/n junction was formed by annealing at 250° C. A transparent electrode and current-collecting electrodes were then formed thereon in the same manner as in Embodiment 1.

In the evaluation of the thus-obtained photovoltaic devices under irradiation of AM-1.5 light (100 mW/cm$^2$), the device with the ZnO layer showed excellent conversion efficiency of 9.5% while the device without ZnO showed inferior efficiency of 7.3% only. These results indicate that the present invention is effective also for semiconductors other than a-Si.

Embodiment 5

In the present embodiment, there was prepared a PIN a-Si photovoltaic device of the configuration shown in FIG. 2, however without metal layer 102. On surface-polished Al plate 101 of 5×5 cm and a thickness of 1 mm, ZnO layer 103a was deposited to an average thickness of 4000 Å, in the apparatus shown in FIG. 6 employing a ZnO target, with a substrate temperature of 300° C. The ZnO surface showed an irregular structure. Then, after the substrate temperature was lowered to room temperature, ZnO layer 103b was deposited to a thickness of 500 Å.

On the thus-obtained rear reflective layer, PIN a-Si semiconductor layer 104, transparent electrode 108, and current-collecting electrode 109 were formed in the same manner as in Embodiment 1 to complete the photovoltaic device. 10 samples were prepared in this manner and evaluated under irradiation of AM-1.5 light (100 mW/cm$^2$). Excellent photoelectric conversion efficiency of 9.7±0.2% was reproducibly obtained. Also, after standing for 1000 hours under the conditions of a temperature of 50° C. and a relative humidity of 90%, these devices showed conversion efficiency of 9.4±0.5%, with almost no deterioration.

Embodiment 6

In the present embodiment there was prepared a PIN a-SiGe photovoltaic device of the configuration shown in FIG. 2. On surface-polished stainless steel plate 101 of 5×5 cm and a thickness of 1 mm, Cu layer 102 with a smooth surface was formed to a thickness of 1500 Å by plating. Subsequently, Zn was ion plated in an oxygen atmosphere with a substrate temperature of 350° C. to deposit a ZnO layer of an average thickness of 1μ, with an irregular surface structure. Then the substrate was immersed in 10% aqueous acetic acid solution for 45 seconds, then dried for 20 minutes in a thermostat chamber of 80° C., and subjected to the deposition of a ZnO layer of a thickness of 700 Å by the above-mentioned ion plating, with the substrate at room temperature.

10 samples were prepared in the same subsequent process as in Embodiment 1, except that an a-SiGe layer, deposited by introducing Si$_2$H$_6$ at 50 sccm, GeH$_4$ at 10 sccm, and H$_2$ at 300 sccm, maintaining the internal pressure of the reaction chamber at 1 Torr, applying electric power of 100 W and maintaining the plasma for 10 minutes, was employed as the i-type layer. In evaluation under irradiation of AM-1.5 light (100 mW/cm$^2$), these devices showed excellent conversion efficiency of 8.7±0.3% in a reproducible manner.

Embodiment 7

A rear reflective layer was continuously prepared by the apparatus shown in FIG. 8. In feed chamber 603, roll 601 of a cleaned stainless steel sheet of a width of 350 mm, a thickness of 0.2 mm, and a length of 500 m was placed. The stainless steel sheet 602 was fed therefrom to take-up chamber 606 through metal layer deposition cheer 604, first layer deposition cheer 605a and second layer deposition cheer 605b. The sheet 602 could be heated to desired temperatures in said chambers by respective heaters 607, 608a, and 608b. The deposition cheer 604 was equipped with target 609 of Al of a purity of 99.99% for depositing an Al layer on the sheet 602 by DC magnetron sputtering. The cheers 605a, 605b were equipped with targets 610a, 610b of ZnO of a purity of 99.9% for depositing ZnO layers in succession by DC magnetron sputtering. There were provided four targets 610a while the target 610b was of a half width, in consideration of the deposition rate and the desired film thickness.

The rear reflective layer was formed with this apparatus in the following manner. The sheet was fed with a speed of 20 cm/min, and was heated to 250° C. at the ZnO deposition by the heater 608a only, while the heater 608b was not used. Argon was supplied at a pressure of 1.5 mTorr, and a DC voltage of 500 V was supplied to the cathodes, whereby there were obtained currents of 6 A in the target 609, 4 A in each of the targets 610a, and 2 A in the target 610b. On the taken-up sheet and Al layer and a thickness of 4300 Å in the total of two layers, and the ZnO layer had a turbid surface.

Figure 11:
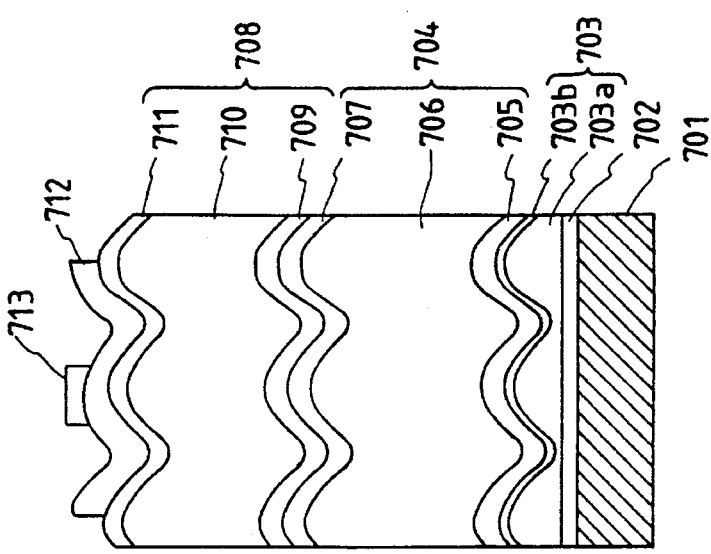
FIG. 11 is a schematic cross-sectional view of another embodiment of the photovoltaic device of the present invention, wherein a first layer has an irregular texture.

On the thus-obtained sheet there was formed a tandem a-Si/a-SiGe photovoltaic device of the configuration shown in FIG. 11, in which there are shown substrate 701; metal layer 702; transparent layer 703; bottom cell 704; top cell 708; first layer 703a of ZnO; second layer 703b of ZnO; n-type a-Si layers 705, 709; p-type μc-Si layers 707, 711; i-type a-SiGe layer 706; and i-type a-Si layer 710. These semiconductor layers were prepared continuously in a roll-to-roll film forming apparatus as disclosed in U.S. Pat. No. 4,492,181. Transparent electrode 712 was deposited by a sputtering apparatus similar to the one shown in FIG. 8. Current-collecting electrode 713 was formed thereon. After the patterning of the transparent electrode and the formation of the current-collecting electrode, the sheet 602 was cut into pieces. Mass production was thus achieved, by effecting the entire process in a continuous manner.

100 samples were prepared in this manner and evaluated under irradiation of AM-1.5 light (100 mW/cm$^2$). Excellent photoelectric conversion efficiency of 11.5±0.2% was obtained in a reproducible manner. Also, after standing for 1000 hours under conditions of a temperature of 50° C. and a relative humidity of 90%, these devices showed conversion efficiency of 11.0±0.6%, with almost no deterioration. Another 100 samples prepared in this manner, irradiated by light corresponding to AM-1. light for 600 hours in the open circuit state, showed an efficiency of 10.7±0.3%, indicating that the deterioration by light is also limited. These results were due to the tandem structure which enabled effective absorption of the longer wavelength region of the light, thereby providing a higher output voltage, and also to the reduced deterioration of the semiconductor layer under light irradiation. Thus, in combination with the effect of the rear reflective layer of the present invention, a photovoltaic device of high conversion efficiency and high reliability could be obtained.

Embodiment 8

A rear reflective layer was formed in the same manner as in Embodiment 5, except for the use of a surface-polished Cu plate as the substrate. Then, on the thus-processed substrate and on a substrate without deposition of a second layer of ZnO, there was deposited Cu and In with respective thicknesses of 0.2 and 0.4μ by sputtering. Subsequently, the samples were transferred to a quartz glass bell gar, heated to 400° C., and supplied with hydrogen selenide (H$_2$Se) diluted to 10% with hydrogen to form a thin film of CuInSe$_2$ (CIS). Then a CdS layer of a thickness of 0.1μ was formed thereon by sputtering, and annealing was conducted at 250° C. to form a p/n junction. Then a transparent electrode and a current-collecting electrode were formed thereon in the same manner as in Embodiment 5.

In evaluation of the thus-obtained photovoltaic devices under irradiation of AM-1.5 light (100 mW/cm$^2$), the devices with two ZnO layers showed high conversion efficiency of 9.6% while the devices with one ZnO layer also showed high efficiency of 9.5%. However, in the measurement of I–V characteristics, devices in which the shunt resistance per unit area does not exceed 200 Ωcm were found in 4% of all the devices with two layers and in 28% of all the devices with one layer. Consequently, the reliability was higher in the two-layered structure.

Embodiment 9

In the present embodiment, there was prepared a PIN a-Si photovoltaic device of the configuration shown in FIG. 3, however without the metal layer 102. On a surface-polished Al plate 101 of 5×5 cm and a thickness of 1 mm, there was deposited ZnO layer 103c of a thickness of 1000 Å, in the apparatus shown in FIG. 6 employing a ZnO target, with the substrate at room temperature. Then, ZnO layer 103d of an average thickness of 3000 Å was deposited thereon, with a substrate temperature of 300° C., whereby the ZnO surface showed an irregular structure.

On the thus-obtained rear reflective layer, there were formed PIN a-Si semiconductor layer 104, transparent electrode 108 and current-collecting electrode 109 in the same manner as in Embodiment 1 to complete a photovoltaic device. 10 samples were prepared in this manner and evaluated under irradiation of AM-1.5 light (100 mW/cm$^2$). There was obtained excellent photoelectric conversion efficiency of 9.6±0.2% in a reproducible manner. Also after standing for 1000 hours under conditions of a temperature of 50° C. and a relative humidity of 90%, these devices showed conversion efficiency of 9.3±0.5%, with almost no deterioration.

Embodiment 10

In the present embodiment, there was prepared a PIN a-SiGe photovoltaic device of the configuration shown in FIG. 3. On surface-polished stainless steel plate 101 of 5×5 cm and a thickness of 1 mm, Cu layer 102 of a thickness of 1500 Å, with a smooth surface, was formed by plating. Then Zn was ion-plated in an oxygen atmosphere with the substrate at room temperature, thus depositing ZnO layer 103c of a thickness of 800 Å.

Subsequently, ZnO layer 103d of a thickness of 1μ, with an irregular surface structure, was deposited by effecting ion plating again, with a substrate temperature of 250° C.

10 samples were prepared by a subsequent process the same as in Embodiment 9, except that the i-type was replaced by an a-SiGe layer which was deposited by introducing Si$_2$H$_6$ at 50 sccm, GeH$_4$ at 10 sccm, and H$_2$ at 300 sccm, maintaining the internal pressure of the reaction chamber at 1 Torr, applying electric power of 100 W and maintaining the plasma for 10 minutes. In evaluation of these devices under irradiation of AM-1.5 light (100 mW/cm$^2$), excellent photoelectric conversion efficiency of 8.6±0.4% could be obtained in a reproducible manner.

Embodiment 11

A rear reflective layer was formed in a continuous manner with an apparatus shown in FIG. 9. In feed chamber 603 there was placed roll 601 of a cleaned stainless steel sheet of a width of 350 mm, a thickness of 0.2 mm, and a length of 500 m. Said stainless steel sheet 602 was fed therefrom to take-up chamber 606, through metal layer deposition chamber 604, first layer deposition chamber 605c, and second layer deposition chamber 605d. The sheet 602 could be heated to desired temperatures at respective deposition chambers, by means of heaters 607, 608c, and 608d. The deposition chamber 604 was equipped with target 609 of Al of a purity of 99.99%, for depositing an Al layer on the sheet 602 by DC magnetron sputtering. The deposition chambers 605c, 605d were equipped with targets 610c, 610d of ZnO of a purity of 99.9%, for depositing ZnO layers in succession by DC magnetron sputtering. The target 610c was of a half width, while there were provided four targets 610d, in consideration of the deposition rate and the desired film thicknesses.

This apparatus was employed in the formation of the rear reflective layer in the following manner. The sheet was fed with a speed of 20 cm/min, and was maintained at 250° C. at the ZnO deposition chamber 605d by the heater 608d only. The heater 608c was not employed, and the substrate was maintained at room temperature. Argon was supplied at a pressure of 1.5 mTorr, and DC voltage of 500 V was applied to the cathodes, whereby there were obtained currents of 6 A in the target 609, 2 A in the target 610c, and 4 A in each of the targets 610d. On the taken-up sheet, the Al layer had a thickness of 1600 Å, while the ZnO layer had an average thickness of 4400 Å in the total of the two layers and had a turbid surface.

Figure 12:
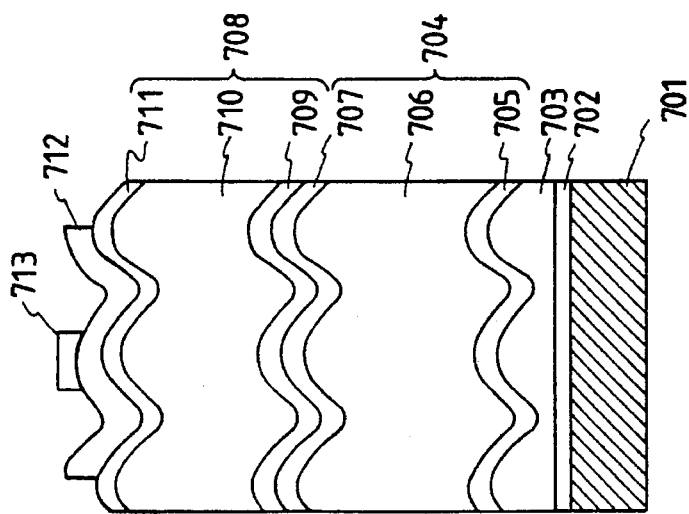
FIG. 12 is a schematic cross-sectional view of another embodiment of the photovoltaic device of the present invention, wherein a second layer has an irregular texture.

A tandem a-Si/a-SiGe photovoltaic device of the configuration shown in FIG. 12 was formed thereon. In FIG. 12 there are shown substrate 701; metal layer 702; transparent layer 703; bottom cell 704; top cell 708; first layer 703c; second layer 703d; n-type a-Si layers 705, 709; p-type μc-Si layers 707, 711; i-type a-SiGe layer 706; and i-type a-Si layer 710. These semiconductor layers were prepared in a continuous manner, with a roll-to-roll film forming apparatus as disclosed in U.S. Pat. No. 4,492,181. Transparent electrode 712 was deposited in a sputtering apparatus similar to the one shown FIG. 9. Current-collecting electrode 713 was formed thereon. After the patterning of the transparent electrode and the formation of the current-collecting electrode, the sheet 602 was cut into pieces. Mass production thus could be achieved by effecting the entire process in continuous manner.

100 samples were prepared in the manner and evaluated under irradiation of AM-1.5 light (100 mW/cm$^2$). Excellent photoelectric conversion efficiency of 11.3±0.2% was obtained in a reproducible manner. Also, after standing for 1000 hours under conditions of a temperature of 50° C. and a relative humidity of 90%, these devices showed conversion efficiency of 11.1±0.6%, with almost no deterioration. Also, another 100 samples prepared in this method showed, after irradiation with light corresponding to AM-1.5 light for 600 hours in the open circuit state, conversion efficiency of 10.7±0.3%, indicating that the deterioration by light is also limited. The results were due to the tandem structure which enabled efficient absorption of the longer wavelength region of the light, thereby elevating the output voltage, and also to the reduced deterioration of the thin film semiconductor layer under the light irradiation. Thus, in combination with the effect of the rear reflective layer of the present invention, there could be obtained a photovoltaic device of a high conversion efficiency and high reliability.

Embodiment 12

A rear reflective layer was prepared in the same manner as in Embodiment 9, except for the use of a surface-polished Cu plate as the substrate. Then, on the thus-treated substrate and on a substrate lacking the deposition of the second ZnO layer, Cu and In were deposited with respective thicknesses of 0.2 and 0.4μ by sputtering. Subsequently, the samples were transferred to a quartz glass bell jar, heated to 400° C. and supplied with hydrogen selenide (H$_2$Se) diluted to 10% with hydrogen, for forming a thin film of CuInSe$_2$ (CIS). Then a CdS layer was deposited thereon with a thickness of 0.1μ by sputtering, and annealing was conducted at 250° C. to form a p/n junction. A transparent electrode and a current-collecting electrode were formed thereon in the same manner as in Embodiment 9.

In evaluation of these photovoltaic devices under irradiation of AM-1.5 light (100 mW/cm$^2$), the device with two ZnO layers showed excellent conversion efficiency of 9.6% while the device with a smooth ZnO layer only showed inferior conversion efficiency of 8.3%. These results indicate that the present invention is effective also with semiconductors other than a-Si.

Embodiment 13

This embodiment shows that integration of a secondary battery, such as a nickel-cadmium (NiCd) battery, can be extremely facilitated by integrating said battery with a solar cell produced by the method of the present invention.

A tandem a-Si/A-SiGe photovoltaic device was prepared in the same manner as in Embodiment 3, except that the roll of stainless steel sheet substrate was replaced by a roll of cold-rolled steel sheet of JISG3141 with a width of 350 mm and a thickness of 0.015 mm, provided with nickel plating of a thickness of 5μ. The transparent electrode was patterned in a size of 58×100 mm, and, after the formation of the current-collecting electrode, the device was cut into a size of 70×110 mm. FIG. 13 shows a battery employing the thus-prepared photovoltaic device as the container. FIG. 13A is an external view of said battery.

The photovoltaic device as explained above is incorporated on the container 1501, and a sturdy bottom plate is provided for withstanding the pressure of the gas generated inside. Said bottom plate does not have the photovoltaic device and serves as the cathode terminal. FIG. 13B shows the internal structure of the battery. Inside the battery there are wound cathode plate 1504 and anode plate 1505, separated by separator 1506. Said plates 1504, 1505 are composed of sintered Ni-Cd alloy, while the separator 1506 is composed of nylon non-woven cloth impregnated with electrolyte solution of potassium hydroxide. The cathode plate 1504 is connected to the container 1501, while the anode plate 1505 is connected to anode terminal 1502. The interior is sealed with plastic lid 1507, equipped with packing 1508, for preventing electrolyte leakage. However, the lid 1507 is provided with safety valve 1509, in order to prevent accidents resulting from a rapid pressure increase at rapid charging or discharging.

Figure 14:
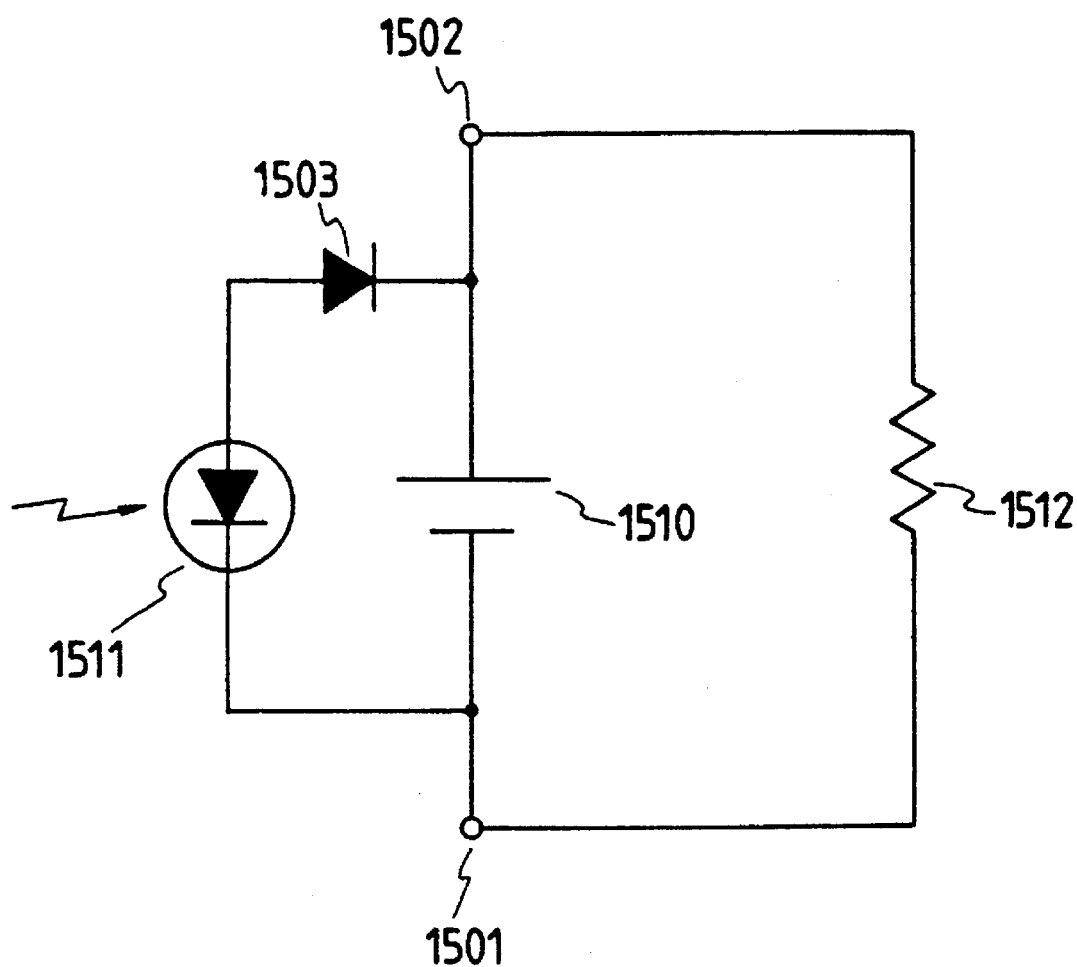
FIG. 14 is an equivalent circuit diagram of an application of the secondary battery, utilizing the photovoltaic device of the present invention.

Grid electrode 1513 on the surface of the photovoltaic device is connected to a lead wire, which is connected to the anode terminal 1502 through diode 1503 for preventing reverse current. In order to protect the surface of the photovoltaic device, a cylindrical heat-shrinkable sheet is placed on the container and heated with hot air, thereby covering the battery except for the anode terminal 1502 and the bottom plate. FIG. 14 shows the equivalent circuit of the above-explained connections. The battery 1510 is connected, by the cathode terminal (container) 1501 and the anode terminal 1502, to external load 1512.

When the photovoltaic device 1511 is irradiated with light, there is generated a photovoltaic force of about 1.6 V, which is applied to the battery 1510. As the voltage of the battery is about 1.2 V at maximum, diode 1503 is biased in the forward direction, and the battery 1510 is charged by the photovoltaic device 1511.

However, when the photovoltaic device 1511 is not irradiated with light, the diode 1503 is biased in the reverse direction, so that current is not supplied unnecessarily from the battery 1510. Also in the case where the battery is charged in an ordinary charger, the charging can be achieved in the usual manner, without the waste of the current flowing in the photovoltaic device 1511, by the function of said diode 1503. Consequently, the battery of the present embodiment, equipped with the photovoltaic device, can be charged by light, by being taken out from the battery case after use and being left in a place with strong light irradiation such as at a window, or even within the battery case if it has a transparent cover. This battery is particularly convenient for use outdoors, since it does not require a particular charger. It can also be charged with an ordinary charger, in the case where rapid charging is required. It can also be formed in the same manner as the ordinary batteries, such as UM1, UM2, or tank-shaped batteries. It can therefore be used in various electric appliances and has a smart appearance.

Two such batteries are loaded in a portable flashlight, and, when they are exhausted, are removed therefrom and allowed to stand aside a sunny window for charging. After a fine day, they are sufficiently charged and can be used again in the flashlight.

Embodiment 14

In an artificial satellite, there is generally employed a compound semiconductor crystalline type solar cell, such as of InP, which has a large output per unit area and is resistant to radiation. However, since such solar cell is composed of wafers, it has to be fixed on a panel. At the satellite launching, the panel has to be compacted and requires a complex fold-unfold mechanism for a plurality of panels. For this reason, even if the output per unit area is high, the output per unit weight has heretofore had to be considerably low.

The present embodiment provides a satellite power source with a large output per unit weight with a simple mechanism, through the use of the solar cell, as an example of the photovoltaic device produced by the method of the present invention.

Figure 15:
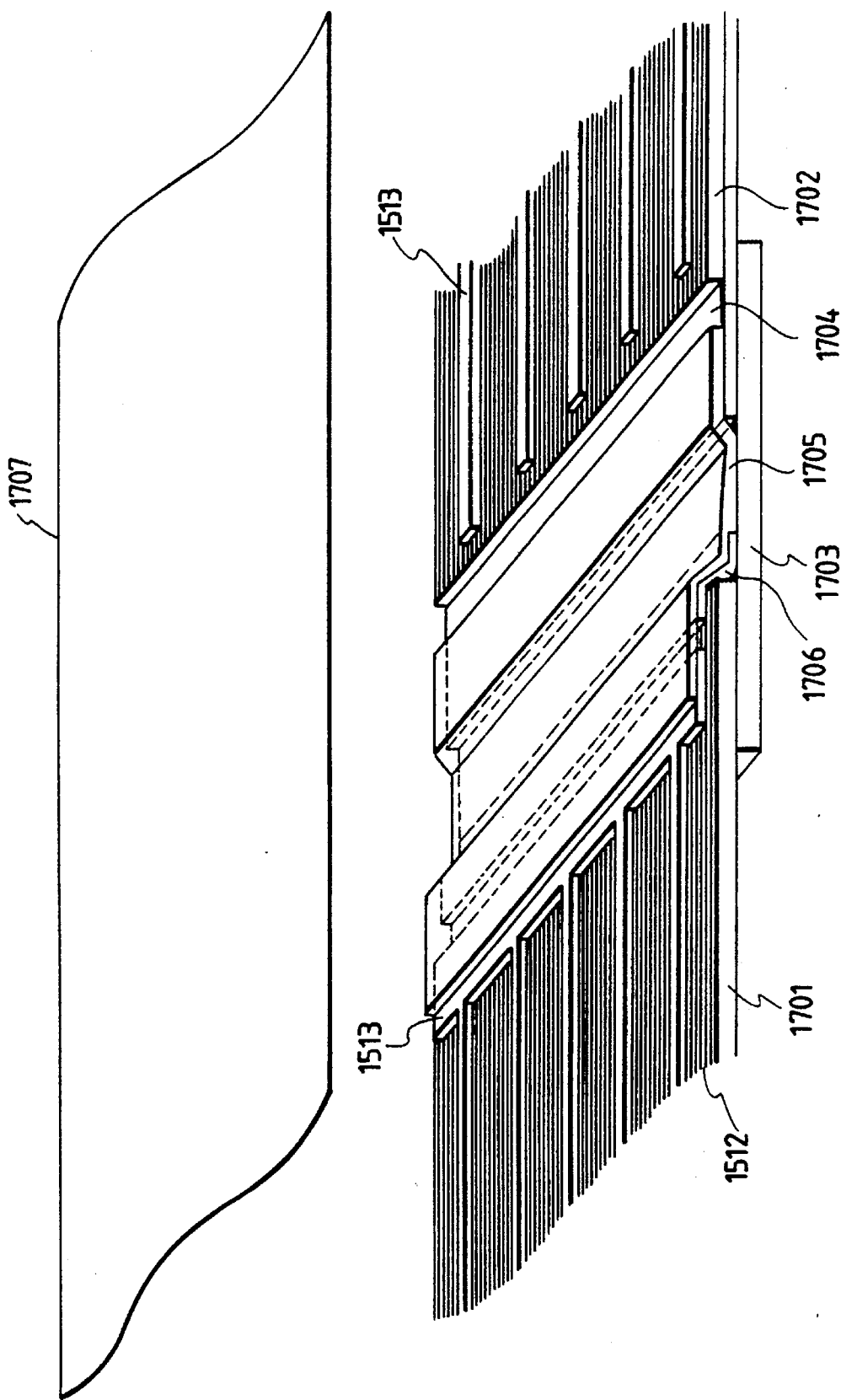
FIG. 15 is a schematic view of a connecting part of a solar cell for an artificial satellite, utilizing the photovoltaic device of the present invention.

Referring to FIG. 15, a tandem a-Si/A-SiGe photovoltaic device was prepared in the same manner as in Embodiment 13, except that the roll of stainless steel substrate was replaced by a roll of an aluminum sheet of JIS2219 (including copper, manganese, etc.) of a width of 350 mm and a thickness of 0.15 mm. Transparent electrode 1512 was patterned into a size of 105×320 mm, and, after the formation of current-collecting electrode 1513, the sheet was cut into pieces. An end of the longer side of each photovoltaic device was polished with a grinder to expose the substrate surface. Then the devices were serially connected as shown in FIG. 15. The devices 1701 and 1702 were connected, with a mutual distance of about 5 mm, from the rear side by means of insulating film 1703 composed, for example, of polystyrene, polyimide, cellulose triacetate or trifluorethylene, and a current-collecting electrode 1513 of the device 1701 and the exposed substrate portion 1704 of the device 1702 were connected by heat pressing with copper sheet 1705 utilizing copper ink or silver ink. For avoiding short-circuiting between the copper sheet 1705 and the substrate of the device 1701, polyimide film 1706 is applied on the edge portion. Protective polyester film 1701 was adhered thereover.

Figure 16:
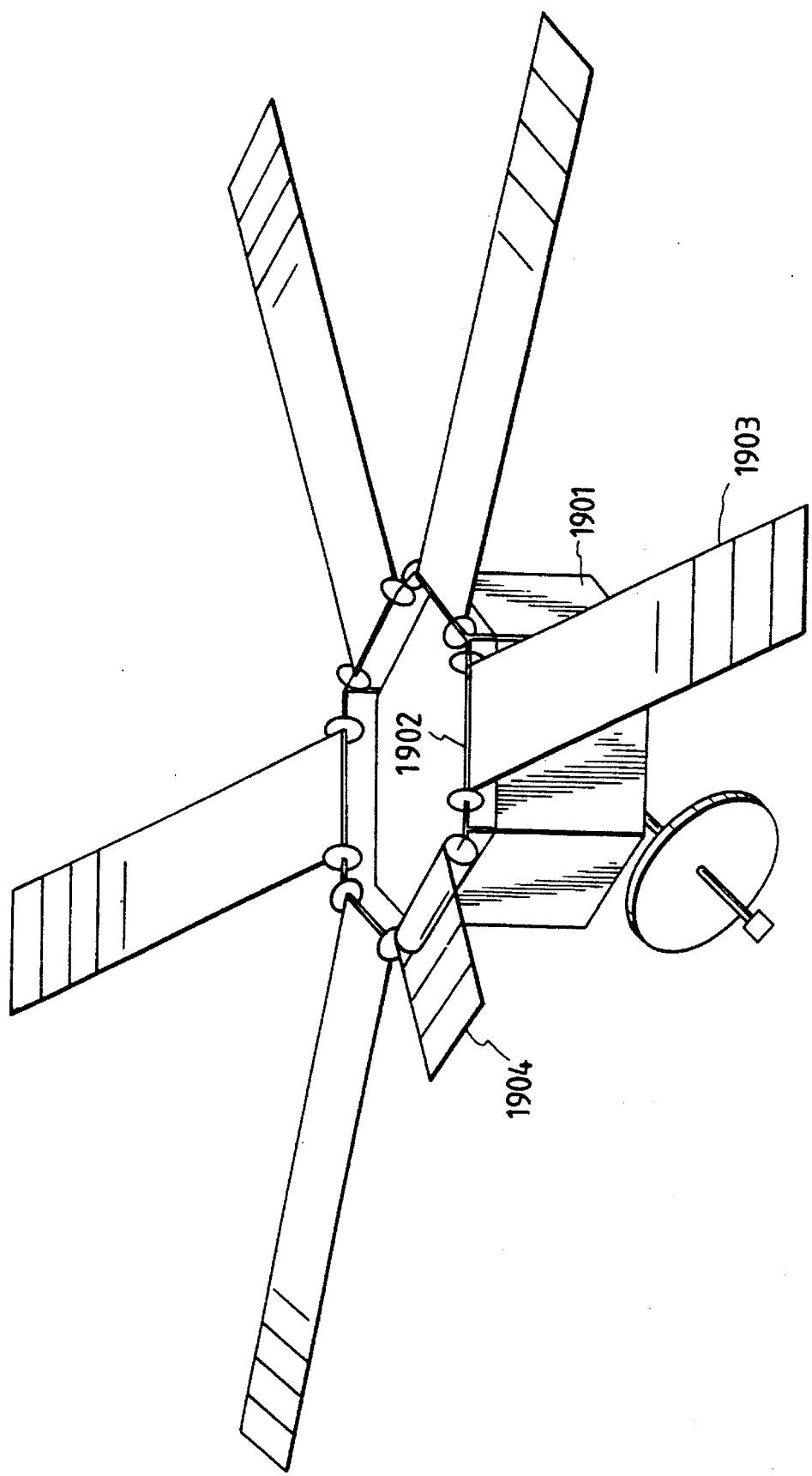
FIG. 16 is a schematic view of an artificial satellite employing the photovoltaic device of the present invention.

200 photovoltaic devices were serially connected to form a solar cell of a length of about 20 m, as an application of the photovoltaic device. Said solar satellite cell can be constructed as shown in FIG. 16. The main body 1901 of the satellite is provided with rotatable shaft 1902, on which sheet-shaped photovoltaic devices 1903, 1904, etc. are wound. 1903 indicates a completely extended state of the device while 1904 indicates a half-wound state. The current generated at the end of the sheet-shaped photovoltaic device is supplied to the main body of the satellite, by means of a cable (not shown) that can be wound together with the photovoltaic device. Said sheet-shaped photovoltaic devices 1903, 1904 and said cable can be extended or wound by a driving system (not shown).

This system is used in the following manner. At the launching of the satellite, the sheet-shaped photovoltaic devices 1903, 1904 are maintained in the wound state. After the satellite is placed on the orbit, it is made to rotate slowly about the rotational axis directed toward the sun. At the same time the sheet-shaped photovoltaic devices are slowly extended, whereby they are stretched radially by centrifugal force and start power generation. In the case of an orbit change, positional change, or recovery of the satellite, the sheet-shaped photovoltaic devices are wound, for example, by a motor. Thereafter they can be extended again, when required, to re-start the power generation. A system with six sheets of the photovoltaic devices has a maximum output of 5 kW with a total weight of ca. 30 kg including the driving system, so that a large output per unit weight can be achieved.

Embodiment 15

Figure 17:
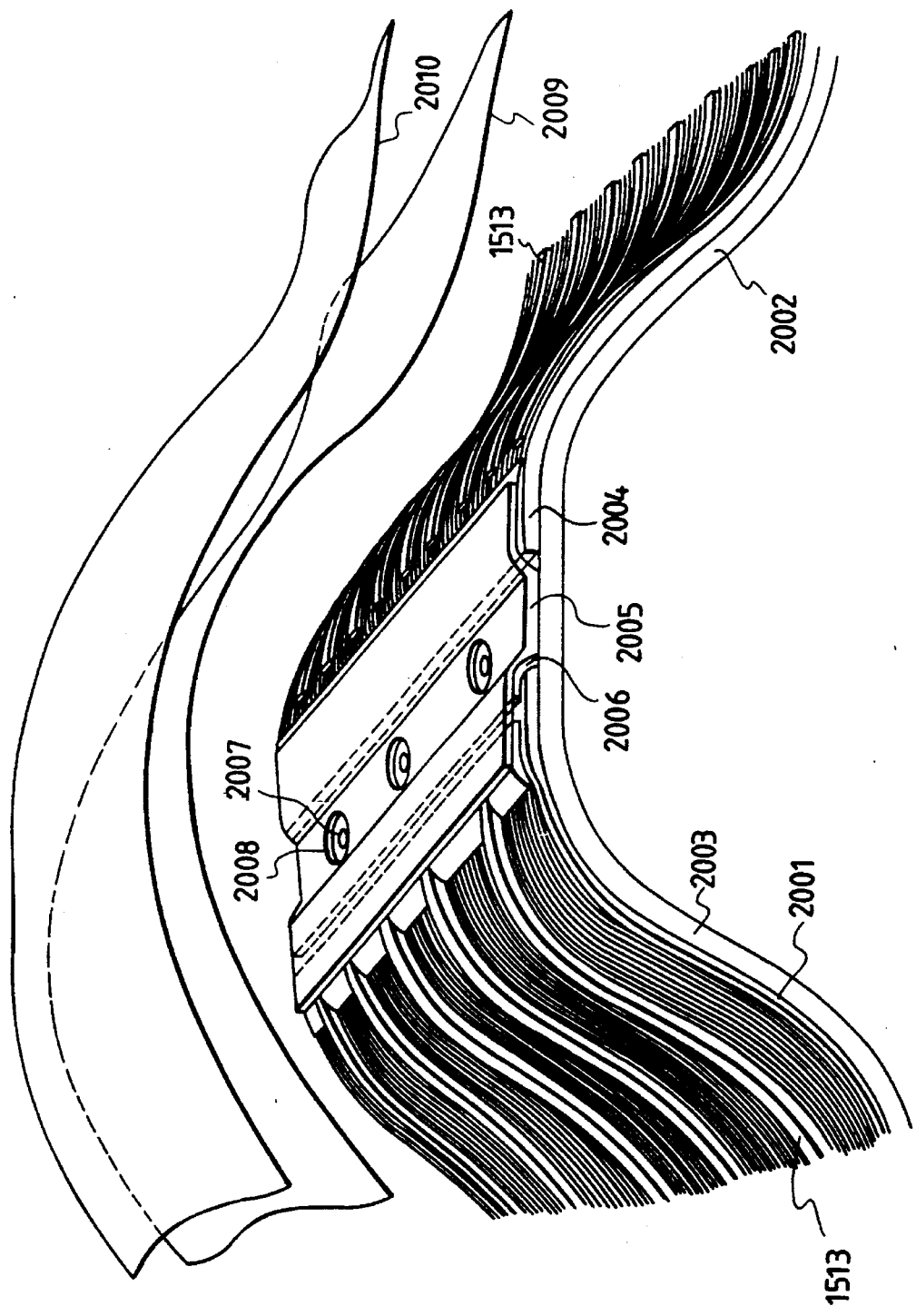
FIG. 17 is a schematic magnified view of a corrugated roofing material employing the photovoltaic device of the present invention.

The present embodiment provides a roofing material obtained by undulated forming of the photovoltaic devices produced by the method of the present invention. A photovoltaic device prepared according to the method of Embodiment 3 was cut into a length of 100 mm and a width of 900 mm, then the obtained sheets were individually pressed into undulated form and adhered to corrugated substrates of a length of 1800 mm and a width of 900 mm, composed, for example, of polyvinyl chloride resin or polyester resin. FIG. 17 shows the details of connection of the photovoltaic devices. Devices 2001 and 2002 are adhered, with a mutual distance of 10 mm, on corrugated substrate 2003.

Figure 18:
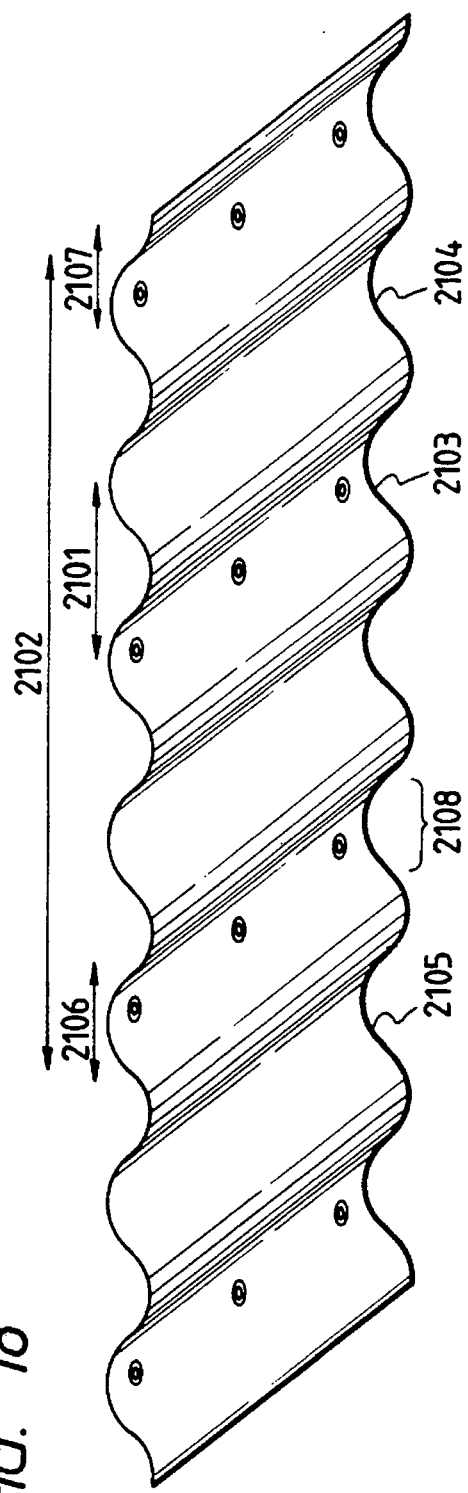
FIG. 18 is a schematic view of a corrugated roofing material employing the photovoltaic device of the present invention.

A grid electrode of the device 2001 and an exposed substrate portion of the device 2002 are connected by copper sheet 2005. There is provided insulating film 2006 for preventing short-circuiting composed, for example, of polyimide resin, polyvinyl alcohol resin, or polystyrene resin. Nail holes 2007 are provided in advance in the corrugated substrate 2003, for fixing the roofing material. For avoiding short-circuiting, the copper sheet 2005 is provided with holes 2008 larger than said nail holes. Said nail holes are provided only in the necessary serial connecting part. PVA resin layer 2009 and fluorinated resin layer 2010 are superposed thereon and adhered by pressurized heating to obtain an integral roofing material. FIG. 18 shows a roof obtained with said roofing materials (number of undulations is each integral roofing material 2102 being reduced for the purpose of simplicity). FIG. 17 shows the details of each photovoltaic device 2101 of the roofing material 2102. At the serial connecting portions 2103, 2104, it is connected to the neighboring photovoltaic devices.

Serial connecting portion 2103 has nail holes but 2104 does not have nail holes. It is fixed, with overlapping of an undulation with another roofing material 2105. The photovoltaic device is not present at the left-hand end of the roofing material 2102. Since the corrugated substrate is transparent, it does not block the light even if it is placed on the adjacent roofing material 2105. The output terminal at the left-hand end of the roofing material 2102 is connected in advance with the output terminal at the right-hand end of the material 2105 before the material 2102 is placed on the portion 2106, and the connecting part is sealed, for example, with anticorrosive paint and is so positioned as not to be exposed to the exterior. In this manner, the serial connection is completed simultaneously with the installation of plural roofing materials.

If the serial connection is not conducted, the output terminal of each device can be connected to a cable which can be guided under convex portion 2108 for supplying the output to the exterior.

A serial connection of four of such roofing materials, when connected in parallel in 8 sets and installed on a roof inclined by 30° toward the south, provides an output of about 5 kW in the summer daytime, sufficient as the electric power source for an ordinary household.

Embodiment 16

The present embodiment provides a photovoltaic device for an automobile, usable for driving a ventilation fan or preventing the discharge of battery. The photovoltaic devices are starting to be employed in automobiles, but they are generally installed on the sun roof or on the stabilizer fin, in order not to affect the automobile design. In fact, a suitable place for installation is difficult to find in automobiles of ordinary specifications. The engine hood or the roof is adequate for receiving the sunlight, but the installation in these locations may easily affect the design of the automobile. Also the front, rear or lateral face of the automobile is susceptible to damage by contact. On the other hand, the rear quarter pillars of the automobile can provide a suitable area, are relatively free from damaging effects and allow easy matching with the automobile design.

The present embodiment utilizes the feature of the photovoltaic device of the present invention, constructed on a sheet-shaped metal substrate, and provides a photovoltaic device having a curved form that can be integrated with the automobile body when installed on the rear quarter pillars.

A photovoltaic device was prepared in the same manner as in Embodiment 14, and individual photovoltaic pieces were obtained by effecting the patterning of the transparent electrode, the formation of the current-collecting electrode and the cutting according to the automobile design.

Figure 19:
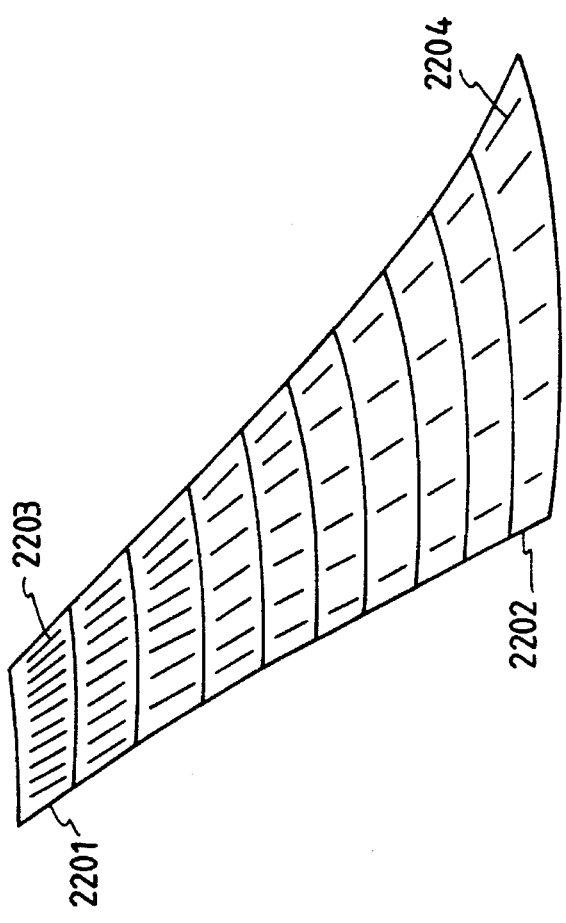
FIG. 19 is a schematic view of a solar cell module employing the photovoltaic device of the present invention and having a current-collecting electrode density which is variable according to the area of the device.

The thus-obtained pieces were serially connected according to the method of Embodiment 15. For use in an automobile equipped with a battery of 12 V, FIG. 19 shows a configuration consisting of 10 solar cell pieces. Pieces 2201 in the upper portion of the pillar are made longer because of the smaller width, while those 2202 in the lower portion are made shorter because of the large width, in such a manner that all the pieces have substantially the same area. Also, the current-collecting electrodes 2203 are provided denser for the longer pieces, in order to suppress the power loss resulting from the resistance in the transparent electrode.

The color of the photovoltaic devices is an important factor in the design, but the thickness of the transparent electrode can be regulated so as to match the color of other parts of the automobile. An ITO transparent electrode with an ordinary thickness of 650 Å provides a purple appearance. Said color becomes yellow-green in a thickness range of 450 to 500 Å, brownish in 500 to 600 Å, purple in 600 to 700 Å, and more bluish in 700 to 800 Å. The output of the photovoltaic device is somewhat lowered when the thickness of the ITO layer is deviated from the standard value, but the loss in efficiency can be minimized in the case of a tandem call, by adjusting the spectral sensitivities of the top and bottom cells, by forming the top cell thinner for a thinner ITO layer because the spectral sensitivity is shifted toward the shorter wavelength, and forming the top cell thicker for a thicker ITO layer.

Figure 20:
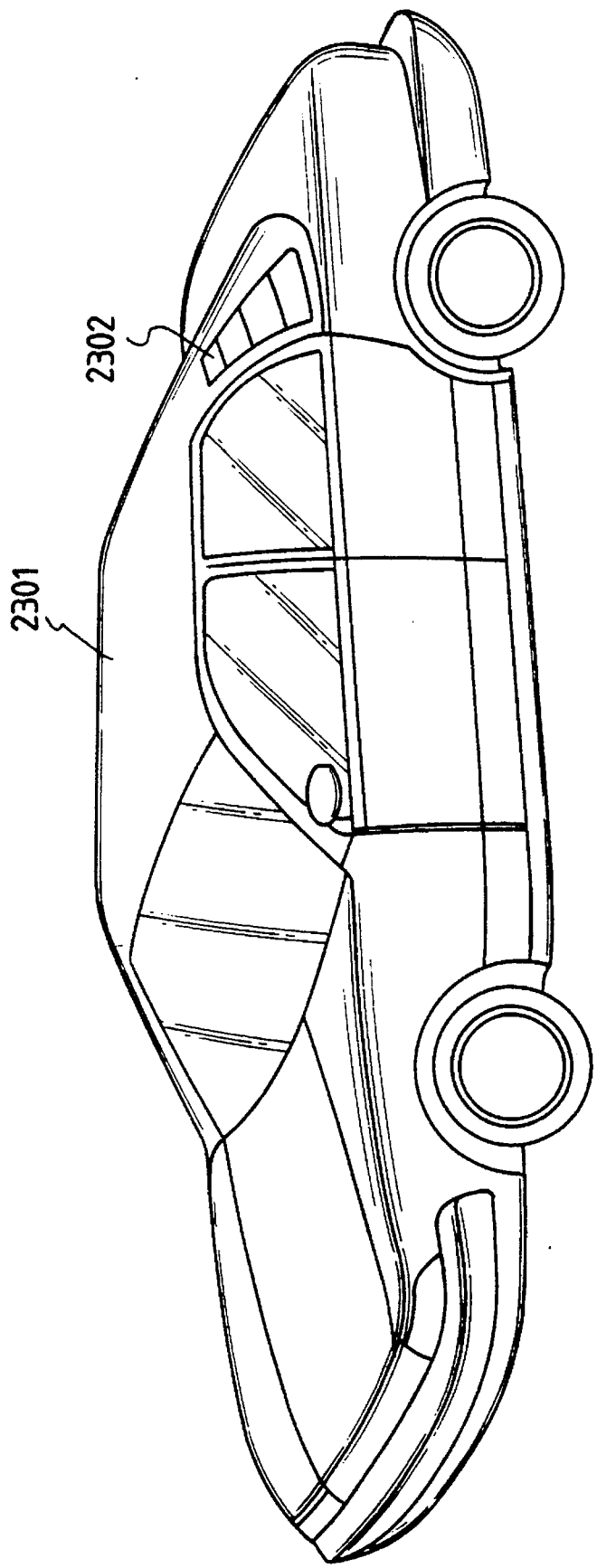
FIG. 20 is a schematic view of an automobile utilizing the photovoltaic device of the present invention.

Photovoltaic modules 2302 of the present embodiment were installed on the left and right rear quarter pillars of 4-door sedan automobile 2301 (coated blue) shown in FIG. 20. FIG. 19 showwos the module for use on the left-side pillar. Said devices are incorporated in a circuit shown in FIG. 21, in which the left-side device 2401 and the right-side device 2402 are respectively connected to battery 2405 through diodes 2403, 2404. Ventilation fan 2406 is activated when the inside temperature is high because of the strong sunlight. Switch 2407 for the ventilation fan 2406 is turned on only when at least either of current sensors 2409, 2410 for detecting the output currents from the left-side and right-side photovoltaic devices provides a high-level signal and temperature sensor 2408 provides a high-level signal.

Such photovoltaic modules can reduce the inside temperature, which easily reaches 80° C. on a fine summer day, by about 30° C., and also avoid the exhaustion of the battery even when it is left unused for a week in mid-winter. Such configuration is also usable in snowy areas, because the snow accumulated on the rear quarter pillars is quickly melted by sunlight.

TABLE 1

| Sample | Substrate | Metal Layer | Transparent layer | Conversion efficiency |
|---|---|---|---|---|
| 1a | stainless steel plate (SUS 430) | Al (1500 Å) smooth surface | ZnO (4000 Å) irregular structure | 9.8% |
| 1b | stainless steel plate | Al, irregular | ZnO | 8.0% |
| 1c | stainless steel plate | Al, smooth | ZnO, smooth | 8.2% |
| 1d | stainless steel plate | — | — | 6.7% |
| 1e | aluminum plate | — | ZnO, irregular | 9.6% |

TABLE 2

| Sample | Substrate | Metal Layer | Transparent layer | Conversion efficiency |
|---|---|---|---|---|
| 2a | stainless steel plate (SUS 430) | silver, smooth | ZnO, irregular | 10.0% |
| 2b | stainless steel plate | silver, irregular | ZnO, irregular | 2.7% |

TABLE 3

| Sample | Substrate | Metal Layer | Transparent layer | Conversion efficiency |
|---|---|---|---|---|
| 3a | stainless steel plate (SUS 430) | Al (1500 Å) smooth | ZnO (non-doped), irregular | 1.5% |
| 3b | stainless steel plate | Al, smooth | ZnO (Cu doped), irregular | 7.4% |

TABLE 4

| Sample | Substrate | Metal layer | Transparent layer 1st layer | Transparent layer 2nd layer | Conversion efficiency |
|---|---|---|---|---|---|
| 6a | stainless steel plate (SUS 430) | Al (1500 Å), irregularity 1000 Å | ZnO (4000 Å) pitch 4000–9000 Å height 2000–4000 Å | ZnO (500 Å) | 10.0% |
| 6b | stainless steel plate (SUS 430) | Al (1500 Å), irregularity 20000 Å | ZnO (4000 Å) pitch 4000–9000 Å height 2000–4000 Å | ZnO (500 Å) | 8.5% |
| 6c | stainless steel plate (SUS 430) | Al (1500 Å), irregularity 1000 Å | ZnO (4000 Å) pitch 4000–9000 Å height 2000–4000 Å | — | 9.7% |
| 6d | stainless steel plate (SUS 430) | Al (1500 Å), irregularity 1000 Å | ZnO (4500 Å) pitch 4000–9000 Å height 2000–4000 Å | — | 9.6% |
| 6e | stainless steel plate (SUS 430) | Al (1500 Å), irregularity 1000 Å | ZnO (4000 Å) pitch 2500 Å max. height 500 Å max. | — | 8.2% |
| 6f | stainless steel plate (SUS 430) | Al (1500 Å), irregularity 1000 Å | ZnO (4500 Å) pitch 2500 Å max. height 500 Å max. | — | 8.0 |
| 6g | aluminum | — | ZnO (4000 Å) pitch 4000–9000 Å height 2000–4000 Å | ZnO (500 Å) | 9.8% |

TABLE 5

| Sample | Substrate | Metal layer | Transparent layer 1st layer | Transparent layer 2nd layer | Conversion efficiency |
|---|---|---|---|---|---|
| 7a | stainless steel plate (SUS 430) | Al (1500 Å), irregularity 1000 Å | ZnO (10000 Å) pitch 6000–10000 Å height 3000–8000 Å | ZnO (500 Å) | 9.9% |
| 7b | stainless steel plate (SUS 430) | Al (1500 Å), irregularity 1000 Å | ZnO (25000 Å) pitch 6000–10000 Å height 3000–8000 Å | ZnO (500 Å) | 9.7% |
| 7c | stainless steel plate (SUS 430) | Al (1500 Å), irregularity 1000 Å | ZnO (25000 Å) pitch 9000–14000 Å height 5000–10000 Å | ZnO (500 Å) | 9.4% |
| 7d | stainless steel plate (SUS 430) | Al (1500 Å), irregularity 1000 Å | ZnO (25000 Å) pitch 18000–28000 Å height 8000–15000 Å | ZnO (500 Å) | 8.6% |

TABLE 6

| Sample | Substrate | Metal layer | Transparent layer 1st layer | Transparent layer 2nd layer | Conversion efficiency |
|---|---|---|---|---|---|
| 9a | stainless steel plate (SUS 430) | Al (1500 Å) irregularity pitch 1000 Å | ZnO (1000 Å) irregularity pitch 1000 Å | ZnO (3000 Å) pitch 4000–8000 Å height 2000–3000 Å | 9.9% |
| 9b | stainless steel plate (SUS 430) | Al (1500 Å) irregularity pitch 2000 Å | ZnO (1000 Å) irregularity pitch 1500 Å | ZnO (3000 Å) | 8.7% |
| 9c | stainless steel plate (SUS 430) | Al (1500 Å) irregularity pitch 1000 Å | ZnO (1000 Å) irregularity pitch 1000 Å | — | 8.3% |
| 9d | stainless steel plate (SUS 430) | Al (1500 Å) irregularity pitch 1000 Å | ZnO (4000 Å) pitch 2500 Å max. height 500 Å max. | — | 8.2% |
| 9e | stainless steel plate (SUS 430) | Al (1500 Å) irregularity pitch 1000 Å | ZnO (4000 Å) pitch 4000–9000 Å height 2000–4000 Å | — | 9.7% |
| 9f | aluminum plate | — | ZnO (1000 Å) irregularity pitch 1000 Å | ZnO (3000 Å) pitch 4000–8000 Å height 2000–3000 Å | 9.7% |

TABLE 7

| Sample | Substrate | Metal Layer | Transparent layer | Conversion efficiency |
|---|---|---|---|---|
| 10a | stainless steel plate (SUS 430) | silver, smooth | two-layered, with irregular structure in the 2nd ZnO layer | 10.3% |
| 10b | stainless steel plate | silver, irregular | two-layered ZnO, irregular structure | 2.9% |

TABLE 8

| Sample | Substrate | Metal layer | Transparent layer 1st layer | Transparent layer 2nd layer | Conversion efficiency |
|---|---|---|---|---|---|
| 11a | stainless steel plate (SUS 430) | Al (1500 Å) irregularity pitch 1000 Å | SnO$_2$ (1500 Å) irregularity pitch 1000 Å | ZnO (10000 Å) pitch 6000–9000 Å height 4000–7000 Å | 9.5% |
| 11b | stainless steel plate (SUS 430) | Al (1500 Å) irregularity pitch 1000 Å | SnO$_2$ (1500 Å) irregularity pitch 1000 Å | ZnO (10000 Å) pitch 8000–15000 Å height 8000–10000 Å | 9.2% |
| 11c | stainless steel plate (SUS 430) | Al (1500 Å) irregularity pitch 1000 Å | SnO$_2$ (1500 Å) irregularity pitch 1000 Å | ZnO (25000 Å) pitch 6000–9000 Å height 4000–7000 Å | 9.3% |
| 11d | stainless steel plate (SUS 430) | Al (1500 Å) irregularity pitch 1000 Å | SnO$_2$ (1500 Å) irregularity pitch 1000 Å | ZnO (25000 Å) pitch 8000–15000 Å height 8000–13000 Å | 9.1% |
| 11e | stainless steel plate (SUS 430) | Al (1500 Å) irregularity pitch 1000 Å | SnO$_2$ (1500 Å) irregularity pitch 1000 Å | ZnO (25000 Å) pitch 17000–26000 Å height 10000–16000 Å | 8.5% |

TABLE 9

| Sample | Subst. temp. | Appearance | SEM Observation |
|---|---|---|---|
| 13a | room temp. | lustrous | irregularity of a pitch of ca. 1000 Å |
| 13b | 100° C. | slightly turbid | irregularity of a pitch of ca. 2000 Å |
| 13c | 200° C. | turbid | irregularity of a pitch of 4000–7000 Å |
| 13d | 300° C. | turbid | irregularity of a pitch of 4000–10000 Å |

TABLE 10

| Sample | Subst. temp. | Appearance | SEM Observation |
|---|---|---|---|
| 14a | room temp. | slightly yellowish, lustrous | irregularity of a pitch of ca. 1000 Å |
| 14b | 100° C. | transparent, lustrous | irregularity of a pitch of ca. 1500 Å |
| 14c | 200° C. | turbid | irregularity of a pitch of 3000–7000 Å |
| 14d | 300° C. | turbid | irregularity of a pitch of 4000–9000 Å |

TABLE 11

| Sample | Subst. temp. | Appearance | SEM Observation |
|---|---|---|---|
| 15a | room temp. | slightly yellowish, lustrous | irregularity of a pitch of ca. 1000 Å |
| 15b | 100° C. | transparent, lustrous | irregularity of a pitch of ca. 1500 Å |
| 15c | 200° C. | turbid | irregularity of a pitch of 3000–7000 Å and a height of 1500–3000 Å |
| 15d | 300° C. | turbid | irregularity of a pitch of 4000–9000 Å and a height of 1500–4000 Å |
| 15e | 200° C., immersed in 10% acetic acid soln. | turbid | pitch 6000–10000 Å height 3000–8000 Å |
| 15f | for 1 min. 200° C., immersed in 10% acetic acid soln. for 1.5 min. | turbid | pitch 9000–14000 Å height 5000–10000 Å |

TABLE 12

| Sample | Subst. temp. | Appearance | SEM Observation |
|---|---|---|---|
| 16a | room temp. | slightly yellowish, lustrous | irregularity of a pitch of ca. 1000 Å |
| 16b | 100° C. | transparent, lustrous | irregularity of a pitch of ca. 1500 Å |
| 16c | 200° C. | turbid | irregularity of a pitch of 3000–7000 Å and a height of 1500–3000 Å |
| 16d | 300° C. | turbid | irregularity of a pitch of 4000–9000 Å and a height of 2000–4000 Å |

The rear reflective layer of the present invention increases light reflectance and achieves effective trapping of light in the semiconductor, whereby light absorption therein is increased and a photovoltaic device of a high conversion efficiency can be obtained. Also, the reliability of the photovoltaic device is improved since the diffusion of metal atoms into the semiconductor film is suppressed, the leakage current is suppressed by a suitable electrical resistance even in the presence of local short-circuits in the semiconductor, and since a higher chemical resistance reduces the danger of new defect formation in the subsequent process.

Also, even if the metal layer becomes exposed in the formation of the irregular surface structure which is required for realizing the effective optical trapping effect, the diffusion of metal atoms from the thus-exposed area to the semiconductor layer can be prevented by the formation of a second layer. Furthermore, the frequency of leakage current between the thus-exposed area and the upper electrode through local short-circuits in the semiconductor can be extremely reduced by the formation of said second layer, whereby the reliability of the photovoltaic device can be improved.

Furthermore, such rear reflective layer can be produced as a part of a mass production method, such as a roll-to-roll method. As explained above, the present invention contributes greatly to the practical applications of photovoltaic devices.

What is claimed is:

1. A method for producing a photovoltaic device provided with a metal layer with a smooth surface, a transparent layer composed of a plurality of layers on said metal layer, and a photovoltaic layer on said transparent layer, which comprises utilizing the difference in forming temperatures of said plural layers of said transparent layer and forming an irregular surface structure in a first said layer in contact with the smooth surface of said metal layer, and satisfying a relation $T1>Tn$ between the forming temperature of $T1$ of said first layer the forming temperature $Tn$ of the second to the nth layers, wherein said layer forming temperatures are numbered as the first layer forming temperature $T1$, the second layer forming temperature $T2 \ldots Tn$ from the metal layer side.

2. A method for producing a photovoltaic device according to claim 1, wherein the irregular surface structure is also formed in said transparent layer by depositing a layer in which said irregularity is to be formed and then immersing the surface of said layer in an aqueous solution of an acid, an alkali, or a salt.

3. A method according to claim 2, wherein said acid is acetic acid, sulfuric acid, hydrochloric acid, nitric acid or perchloric acid, said alkali is sodium hydroxide, potassium hydroxide or aluminum hydroxide, and said salt is ferric chloride or aluminum chloride.

4. A method for producing a photovoltaic device provided with a metal layer having a smooth surface, a transparent layer composed of a plurality of layers on said metal layer, and a photovoltaic layer on said transparent layer, which comprises utilizing the difference in forming temperature of said plural layers of said transparent layer and forming an irregular surface structure in at least one layer other than the one in contact with the smooth surface of said metal layer, and satisfying a relation $T1<Tn$ between the forming temperature $T1$ of said first layer and the forming temperature $Tn$ of the second to nth layers, wherein said layer forming temperatures are numbered as the first layer forming temperature $T1$, the second layer forming temperature $T2 \ldots Tn$ from the metal layer side.

5. A method for producing a photovoltaic device according to claim 4, wherein the irregular-surface structure is also formed in said transparent layer by depositing a layer in which said irregularity is to be formed and then immersing the surface of said layer in an aqueous solution of an acid, an alkali, or a salt.

* * * * *